United States Patent
Muramoto et al.

(10) Patent No.: US 7,597,774 B2
(45) Date of Patent: Oct. 6, 2009

(54) APPARATUS AND METHOD FOR FABRICATING BONDED SUBSTRATE

(75) Inventors: Takanori Muramoto, Kasugai (JP); Takuya Ohno, Kasugai (JP); Tsukasa Adachi, Kasugai (JP); Koji Hashizume, Kasugai (JP); Yosimasa Miyajima, Kasugai (JP); Takao Kojima, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/254,744

(22) Filed: Oct. 21, 2005

(65) Prior Publication Data
US 2006/0032583 A1    Feb. 16, 2006

Related U.S. Application Data

(62) Division of application No. 10/347,625, filed on Jan. 22, 2003, now Pat. No. 7,137,427.

(30) Foreign Application Priority Data
Mar. 19, 2002    (JP)    ............................ 2002-076173

(51) Int. Cl.
*B29C 65/00* (2006.01)
(52) U.S. Cl. ...................... 156/285; 156/286; 156/381; 156/382; 269/21; 347/187
(58) Field of Classification Search ............. 156/285, 156/382, 286, 381; 269/21; 349/187
See application file for complete search history.

(56) References Cited

U.S. PATENT DOCUMENTS

| | | | |
|---|---|---|---|
| 4,424,092 A | 1/1984 | Salenz | 156/391 |
| 4,808,059 A | 2/1989 | Eddy | |
| 5,407,519 A | 4/1995 | Joffe et al. | 156/358 |
| 5,564,682 A | 10/1996 | Tsuji | |
| 5,645,474 A | 7/1997 | Kubo et al. | 451/287 |
| 5,706,843 A | 1/1998 | Matsuo | |
| 5,707,051 A | 1/1998 | Tsuji | |
| 5,741,558 A | 4/1998 | Otani et al. | 427/469 |
| 5,766,671 A | 6/1998 | Matsui | 427/6 |
| 5,902,678 A | 5/1999 | Konda et al. | 428/345 |

(Continued)

FOREIGN PATENT DOCUMENTS

JP    62-211245    9/1987

(Continued)

OTHER PUBLICATIONS

U.S. Appl. No. 10/347,625, filed Sep. 22, 2003, Takanori Muramoto et al., Fujitsu Limited.

(Continued)

*Primary Examiner*—Richard Crispino
*Assistant Examiner*—Christopher Schatz
(74) *Attorney, Agent, or Firm*—Staas & Halsey LLP

(57) ABSTRACT

A bonded-substrate fabricating apparatus capable of reducing defective bonded substrates fabricated. A transfer robot sucks the outer edge area of the bottom surface of a substrate and spouts gas toward the bottom surface of the substrate to carry the substrate into a vacuum process chamber of a press machine while keeping the substrate horizontally. A press plate holds the substrate, which is held by the transfer robot, by suction.

4 Claims, 16 Drawing Sheets

U.S. PATENT DOCUMENTS

| | | | |
|---|---|---|---|
| 5,989,346 | A | 11/1999 | Hiroki |
| 6,022,185 | A | 2/2000 | Mokuo |
| 6,222,603 | B1 | 4/2001 | Sakai et al. |
| 6,231,706 | B1 | 5/2001 | Higaki et al. ............... 156/74 |
| 6,254,716 | B1 | 7/2001 | Russel et al. |
| 6,328,838 | B1 | 12/2001 | Wirth et al. |
| 6,646,689 | B2 | 11/2003 | Matsuda |
| 6,793,756 | B2 | 9/2004 | Lee et al. |
| 6,798,488 | B2* | 9/2004 | Murata et al. ............... 349/187 |
| 6,829,032 | B2 | 12/2004 | Lee et al. ............... 349/187 |
| 6,953,073 | B2 | 10/2005 | Lee et al. |
| 6,991,699 | B2* | 1/2006 | Lee et al. ............... 156/285 |
| 7,096,911 | B2 | 8/2006 | Hashizume et al. |
| 7,354,494 | B2 | 4/2008 | Miyajima et al. |
| 2002/0062787 | A1 | 5/2002 | Hashizume et al. |
| 2004/0149379 | A1* | 8/2004 | Kobayashi et al. ............... 156/285 |
| 2006/0027318 | A1 | 2/2006 | Hashizume et al. |
| 2006/0037707 | A1 | 2/2006 | Muramoto et al. |
| 2006/0048896 | A1 | 3/2006 | Muramoto et al. |
| 2007/0034332 | A1 | 2/2007 | Muramoto et al. |

FOREIGN PATENT DOCUMENTS

| | | |
|---|---|---|
| JP | 01-214042 | 8/1989 |
| JP | 05-190414 | 7/1993 |
| JP | 6-69315 | 3/1994 |
| JP | 07-058191 | 3/1995 |
| JP | 08-236597 | 9/1996 |
| JP | 08-316288 | 11/1996 |
| JP | 9-243982 | 9/1997 |
| JP | 9-246352 | 9/1997 |
| JP | 9-266242 | 10/1997 |
| JP | 11-262828 | 9/1999 |
| JP | 2000-82732 | 3/2000 |
| JP | 2000-258746 | 9/2000 |
| JP | 2000-284295 | 10/2000 |
| JP | 2001-085494 | 3/2001 |
| JP | 2001-087719 | 4/2001 |
| JP | 2001-282126 | 10/2001 |
| JP | 2001-356353 | * 12/2001 |
| JP | 2002-040398 | 2/2002 |
| JP | 2003-137616 | 5/2003 |
| JP | 2003-241202 | 8/2003 |
| KR | 10-0272186 | 3/1994 |
| KR | 1998-041650 | 8/1998 |
| KR | 10-0272186 | 8/2000 |
| KR | 10-2001-0038101 | 5/2001 |
| WO | WO 00/11527 | 3/2000 |

OTHER PUBLICATIONS

Japanese Office Action for corresponding application 2006-082407 mailed on Jan. 29, 2008.
Japanese Office Action for corresponding application 2005-371994 mailed on Jan. 29, 2008.
Japanese Office Action for corresponding application 2005-371993 mailed on Jan. 29, 2008.
Chinese Patent Office Action, mailed Oct. 19, 2007 and issued in corresponding Chinese Patent Application No. 200610099809.X.
Chinese Patent Office Action, mailed Oct. 19, 2007 and issued in corresponding Chinese Patent Application No. 200610099808.5.
English language Abstract of Korean Patent Publication No. 2001-0020690.
U.S. Appl. No. 10/347,625, filed Jan. 22, 2003, Takanori Muramoto et al., Fujitsu Limited.
U.S. Appl. No. 11/254,712, filed Oct. 21, 2005, Takanori Muramoto et al., Fujitsu Limited.
U.S. Appl. No. 11/254,741, filed Oct. 21, 2005, Takanori Muramoto et al., Fujitsu Limited.
U.S. Appl. No. 11/580,908, filed Oct. 16, 2006, Takanori Muramoto et al., Fujitsu Limited.
Korean Patent Office Action, mailed Aug. 1, 2007 and issued in related Korean Patent Application No. 10-2006-0040807.
Korean Patent Office Action, mailed Aug. 1, 2007 and issued in related Korean Patent Application No. 10-2006-0040806.
Korean Patent Office Action, mailed Aug. 1, 2007 and issued in related Korean Patent Application No. 10-2006-0040801.
Chinese Patent Office Action, mailed Nov. 2, 2007 and issued in corresponding Chinese Patent Application No. 200610099807.0.
Chinese Patent Office Action, mailed Nov. 2, 2007 and issued in corresponding Chinese Patent Application No. 200610099803.2.
U. S. Office Action issued on Nov. 23, 2007 for co-pending U.S. Appl. No. 11/254,712, filed Oct. 21, 2005.
U.S. Office Action issued on Nov. 23, 2007 for co-pending U.S. Appl. No. 11/254,741, filed Oct. 21, 2005.
Korean Office Action for corresponding Korean application 10-2008-0100401; dated Nov. 13, 2008.
Office Action for corresponding U.S. Appl. No. 11/254,741; mailed on Mar. 18, 2009.

* cited by examiner

Fig.11A Fig.11B
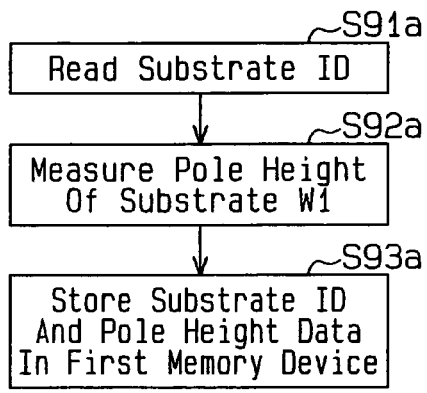
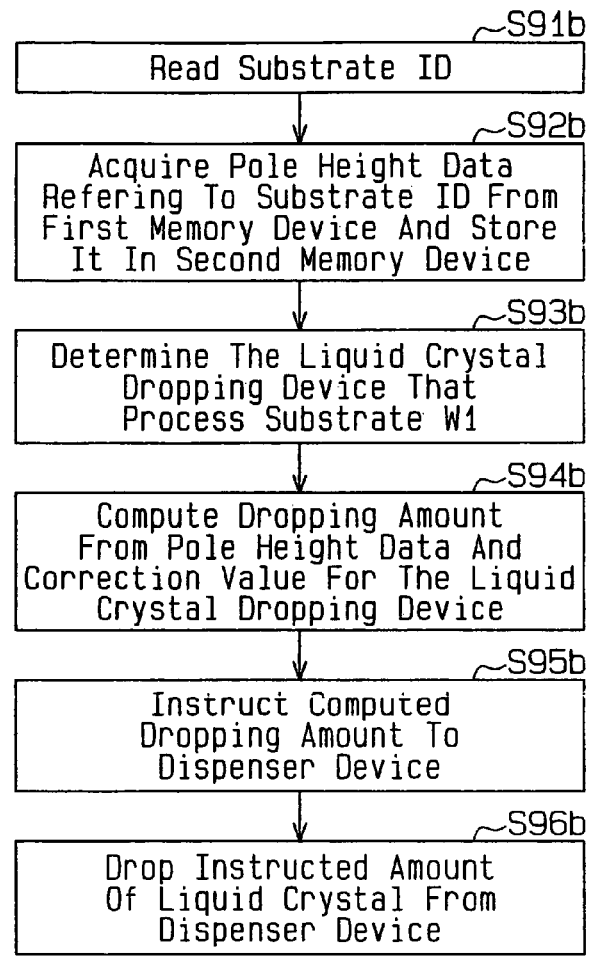

Fig.17
From S47 (Fig.5) or S70 (Fig.6)
S151 — Open Gas Inlet Valve And Slightly Open First And Second Exhaust Valves
S152 — Gradually Increase The Degrees Of Opening Of Exhaust Valves To Lower Back Pressure Of Substrate W2
S153 — Fully Open Exhaust Valves When Chamber Pressure And Back Pressure Of Substrate W2 Reach Predetermined Pressures
To S49 (Fig.5) or S70 (Fig.6)

APPARATUS AND METHOD FOR FABRICATING BONDED SUBSTRATE

CROSS-REFERENCE TO RELATED APPLICATIONS

This application is a divisional of application Ser. No. 10/347,625, filed Jan. 22, 2003, now U.S. Pat. No. 7,137,427.

This application is based upon and claims the priority of Japanese application no. 2002-076173, filed Mar. 19, 2002, and U.S. patent application Ser. No. 10/347,625, filed Jan. 22, 2003, the contents being incorporated herein by reference.

BACKGROUND OF THE INVENTION

The present invention relates to an apparatus and method for fabricating bonded substrate (panel). More particularly, the present invention relates to an apparatus and method for fabricating bonded substrate for a liquid crystal display (LCD), which is provided by bonding two substrates at a predetermined gap.

Nowadays, there are demands for large and thin liquid crystal display (LCD) panels capable of providing fine display on a large display area, and apparatus which fabricates such LCD panels have been developed. An LCD panel is fabricated by arranging two glass substrates to face each other at an extremely narrow gap (several micrometers) and filling a liquid crystal between the two glass substrates. The two glass substrates are, for example, an array substrate on which a plurality of TFTs (Thin Film Transistors) are formed in a matrix form and a color filter substrate on which color filters (red, green and blue), a light shielding film, etc. are formed. The light shielding film contributes to improving contrast and shields light toward the TFTs to prevent generation of an optical leak current. The array substrate is bonded to the color filter substrate by a sealing material (adhesive) containing a thermosetting resin.

A method of fabricating an LCD panel includes a liquid crystal sealing step of sealing a liquid crystal between two glass substrates. The conventional liquid crystal sealing step is carried out by the following vacuum injection method. First, the TFT-formed array substrate is bonded to the color filter substrate (opposing substrate) via a sealing material. The sealing material is cured. The bonded substrates and a liquid crystal are placed in a vacuum tank and an inlet port provided in the sealing material is dipped in the liquid crystal. The pressure in the tank is set back to the atmospheric pressure so that the liquid crystal is sucked from the inlet port. Finally, the inlet port of the sealing material is sealed.

Recently, attention has been paid to the following dropping method instead of the vacuum injection method. First, the frame of a sealing material is formed in such a way as to enclose the outer periphery of the array substrate. A predetermined dose of a liquid crystal is dropped on the surface of the array substrate within the frame of the sealing material. Finally, the array substrate is bonded to the color filter substrate in vacuum. The dropping method can reduce the amount of a liquid crystal in use significantly and can shorten the time needed for the liquid crystal sealing step, thus resulting in a reduction in panel fabrication cost. It is therefore expected that mass production will be improved.

A bonded-substrate fabricating apparatus which operates according to the dropping method has the following problems.

1. Improper Chuck Originated from the Bending of Substrate

Normally, a substrate is held by suction by vacuum chuck or chucking by electrostatic chuck. In the vacuum-chuck holding, a holding plate which can hold a substrate by vacuum suction is used. The array substrate is held by the holding plate and the frame of the sealing material is formed on the array substrate. The adequate amount of a liquid crystal is dropped on the surface of the array substrate from a dispenser. Finally, the array substrate is bonded to the color filter substrate in a vacuum atmosphere.

In the electrostatic-chuck holding, a holding plate which has an electrode is used. A voltage is applied between the electrode of the holding plate and a conductive film formed on a glass substrate to generate Coulomb's force between the glass and the electrode. The Coulomb's force electrostatically holds the glass substrate on the holding plate.

In the vacuum-chuck holding, when the degree of vacuum in the process chamber becomes as high as a certain level, vacuum chuck does not work. In this respect, the substrate is electrostatically held by electrostatic chuck before suction by vacuum chuck stops working.

Normally, two substrates are separately held by an upper holding plate and a lower holding plate and are bonded together. Specifically, to prevent transfer of dust on the bonded surfaces or contamination thereof, the outer edge areas (portions outward of the frame of the sealing material) of the substrates are held by a transfer robot and are moved into the process chamber. However, the large and thin substrates are likely to curve (bend) due to their dead loads. The holding plates cannot stably hold the bent substrates. If the process chamber is depressurized for the purpose of bonding the substrates, therefore, the misalignment of the substrates or separation of the substrates from the holding plates may occur.

In a case where the holding plate (electrostatic chuck) electrostatically holds a bent substrate, glow discharge occurs during depressurization of the process chamber. This case brings about a problem such that a circuit or TFT devices formed on the substrate are damaged, resulting in generation of defects. In addition, as air remains between the holding plate and the substrate, the substrate may be released from the electrostatic chuck while depressurizing the process chamber.

2. Improper Bonding Originated from the Bending of Substrate

In the bonding step, two substrates are pressed while keeping a predetermined substrate gap. The important factors in the bonding step are to keep the two substrates parallel to each other and to press the two substrates with a uniform load. If the substrates are bent, however, the frame of the sealing material is pressed unevenly in the bonding step, so that the liquid crystal may be pushed out of the frame of the sealing material. If the pressing pressure is uneven, the pressing pressure needed to seal the liquid crystal increases so that the influence on the substrates becomes greater. This makes it difficult to fabricate stable products.

3. Dust Oriented Improper Chuck

The holding plates that hold the two substrates separately have chuck surfaces which are planarized at a high precision. In a case where dust or glass pieces are adhered to the chuck surfaces, the dust is transferred onto the substrates, causing the misalignment of the substrates or separation of the substrates from the holding plates. As minute dust is adhered to the holding plates by electrostatic force, however, it is difficult to remove the dust from the holding plates.

4. Defects Originated from Variation in Cell Thickness

It is necessary to properly adjust the amount of a liquid crystal to be sealed in an extremely narrow substrate gap (cell thickness). The gap between the two substrates is determined by placing spacers between the substrates or forming poles on one of the substrates. However, the spacers and poles have a slight height variation. This results in a change in the substrate gap, so that the amount of the liquid crystal sealed may become too much or too little locally. This would bring about a problem such that the cell thickness would vary after the substrates were bonded. The variation in cell thickness cause uneven display of the LCD panel.

SUMMARY OF THE INVENTION

Accordingly, it is an objective of the present invention to provide a bonded-substrate fabricating apparatus and fabricating method which can suppress fabrication of defective bonded substrates.

To achieve the above object, the present invention provides an apparatus for fabricating a bonded substrate by bonding a first substrate and a second substrate, each of the first substrate and the second substrate having an inner surface to be bonded and an outer surface opposite to the inner surface. The apparatus includes a first holding plate for holding the first substrate, a second holding plate arranged to face the first holding plate for holding the second substrate by chucking the outer surface of the second holding plate, and a transfer machine which transfers the first and second substrates to the first and second holding plates respectively and includes a holding member for holding the second substrate horizontally by chucking the second substrate and spouting gas onto the inner surface of the second substrate.

A further perspective of the present invention is an apparatus for fabricating a bonded substrate by bonding a first substrate and a second substrate, each of the first substrate and the second substrate having an inner surface to be bonded and an outer surface opposite to the inner surface. The apparatus includes a first holding plate for holding the first substrate by chucking the outer surface of the first holding plate, a second holding plate arranged to face the first holding plate for holding the second substrate by chucking the outer surface of the second holding plate, and a transfer machine which transfers the first and second substrates to the first and second holding plates respectively and includes a holding member for holding the first and second substrates by chucking the outer surfaces of the first and second substrates.

A further perspective of the present invention is an apparatus for fabricating a bonded substrate by bonding a first substrate and a second substrate, each of the first substrate and the second substrate having an inner surface to be bonded and an outer surface opposite to the inner surface. The apparatus includes a transfer machine which transfers the first and second substrates and includes a holding member for holding the first and second substrates by chucking the outer surfaces of the first and second substrates, a first holding plate for holding the first substrate transferred by the transfer machine, and a second holding plate arranged to face the first holding plate for holding the second substrate transferred by the transfer machine. At least one of the first and second holding plates has a channel for retaining the associated holding member when transfer of the associated holding member from the transfer machine is executed.

A further perspective of the present invention is an apparatus for fabricating a bonded substrate by bonding a first substrate and a second substrate. The apparatus includes a transfer machine which transfers the first and second substrates and includes a plurality of holding members for holding the first and second substrates horizontally, a first holding plate having a chuck surface for chucking the first substrate transferred by the transfer machine, and a second holding plate arranged to face the first holding plate and having a chuck surface for chucking the second substrate transferred by the transfer machine. At least one of the first and second holding plates includes a chuck mechanism which is movable up and down independently of the associated chuck surface and sucks and holds the associated substrate. The associated chuck surface holds the associated substrate held by the chuck mechanism by at least one of suction and electrostatic force.

A further perspective of the present invention is a method of fabricating a bonded substrate by bonding two substrates in a process chamber. The method includes sucking at least one substrate and causing a holding plate to hold that substrate under an atmospheric pressure, depressurizing the process chamber, stopping suction of the at least one substrate to make a back pressure of the at least one substrate approximately equal to a pressure in the process chamber, and causing the at least one substrate to be electrostatically held by the holding plate.

A further perspective of the present invention is a method of fabricating a bonded substrate by bonding two substrates in a process chamber. The method includes sucking at least one substrate and causing a holding plate to hold that substrate under an atmospheric pressure, depressurizing the process chamber, changing a pressure in the process chamber to a value higher than the atmospheric pressure by a predetermined pressure, and stopping suction of the at least one substrate to electrostatically hold that substrate.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIGS. 11A and 11B are flowcharts of the control method for the amount of the liquid crystal;

FIG. 17 is a flowchart of a bonding method which is executed by the press machine in FIG. 16.

DETAILED DESCRIPTION OF THE PREFERRED EMBODIMENTS

A bonded-substrate fabricating apparatus 10 according to the first embodiment of the present invention will be described below.

The bonded-substrate fabricating apparatus 10 injects a liquid crystal between a first substrate W1 and a second substrate W2 and bonds the substrates W1 and W2 to fabricate a liquid crystal display. The liquid crystal display is, for example, an active matrix type liquid crystal display panel. The first substrate W1 is an array substrate (TFT substrate) of glass which has an array of TFTs, and the second substrate W2 is a color filter (CF) substrate which has color filters and a light shielding film. The substrates W1 and W2 are fabricated separately and are supplied to the bonded-substrate fabricating apparatus 10.

Figure 1:
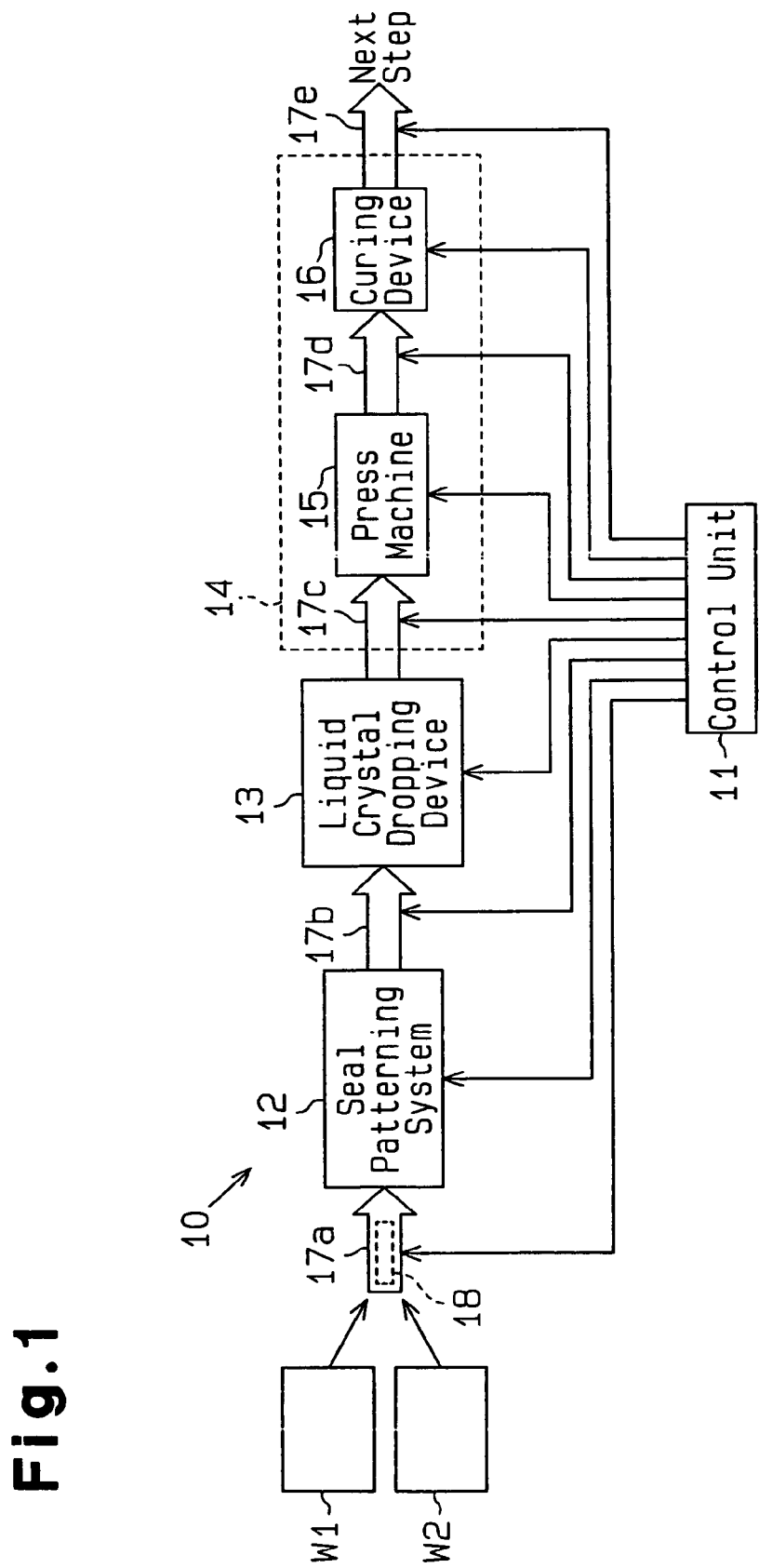
FIG. 1 is a block diagram of a bonded-substrate fabricating apparatus according to the present invention.

As shown in FIG. 1, the bonded-substrate fabricating apparatus 10 includes a control unit 11, a seal patterning system 12, a liquid crystal dropping device 13 and a bonding device 14. The bonding device 14 comprises a press machine 15 and a curing device 16. The control unit 11 controls the seal patterning system 12, the liquid crystal dropping device 13 and the bonding device 14 (the press machine 15 and curing device 16). Each of the components 11 to 13, 15 and 16 is used in the plural as needed.

The bonded-substrate fabricating apparatus includes first to fifth transfer equipments 17a to 17e which transfer the first substrate W1 and the second substrate W2. The control unit 11 controls the first to fifth transfer equipments 17a to 17e and a transfer robot 31 (see FIG. 2) provided in the bonding device 14 to transfer the first substrate W1 and the second substrate W2 and an bonded substrate (integrated substrate).

The first transfer equipment 17a transfers the first substrate W1 and the second substrate W2 to the seal patterning system 12. The first transfer equipment 17a has an ID reader 18 for reading identification information (substrate ID) to distinguish the types of the first substrate W1 and the second substrate W2. As the first substrate W1 and the second substrate W2 are supplied to the first transfer equipment 17a, the ID reader 18 reads the substrate ID in response to a control signal from the control unit 11 and the first transfer equipment 17a transfers the first substrate W1 and the second substrate W2 to the seal patterning system 12. The control unit 11 controls the dropping amount of a liquid crystal based on the substrate ID.

The seal patterning system 12 receives the first substrate W1 and the second substrate W2 and applies a sealing material in predetermined positions on the top surface of one of the first substrate W1 and the second substrate W2 (the first substrate W1 in the first embodiment) along the periphery, thereby forming the frame of the sealing material. The sealing material is preferably an adhesive including a photocuring adhesive.

The second transfer equipment 17b receives the first substrate W1 and the second substrate W2 from the seal patterning system 12 and transfers the first substrate W1 and the second substrate W2 as a set to the liquid crystal dropping device 13.

After the sealing material is applied, the liquid crystal dropping device 13 drops a liquid crystal at predetermined positions on the top surface of the first substrate W1. After the dropping, the first substrate W1 and the second substrate W2 are transferred to the bonding device 14 by the third transfer equipment 17c.

Figure 12:
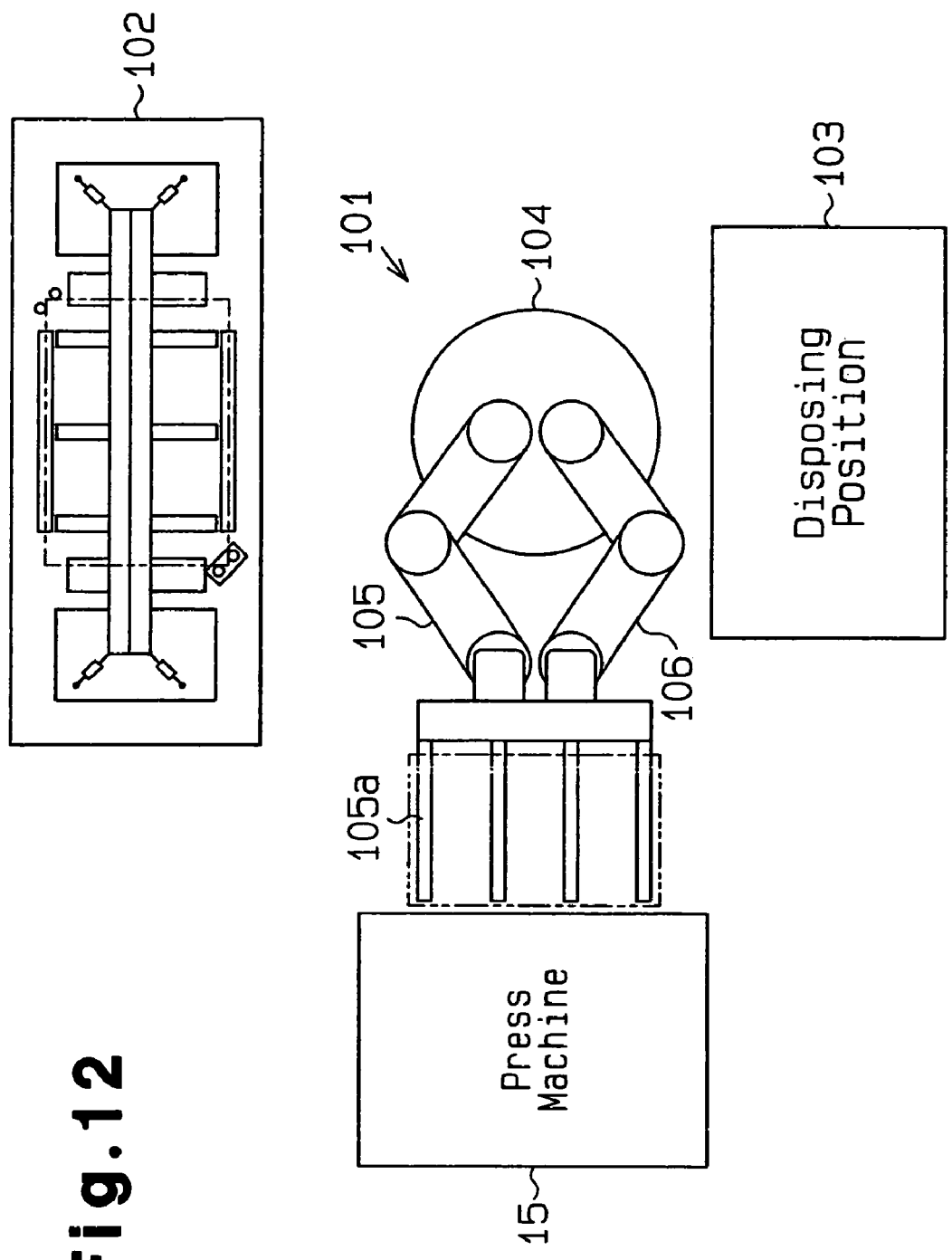
FIG. 12 shows the layout of a transfer robot according to a second embodiment of the present invention.

The press machine 15 of the bonding device 14 is provided with a positioning device 102 (see FIG. 12). The first substrate W1 and the second substrate W2 are transferred to the positioning device 102. The first substrate W1 and the second substrate W2 should be bonded after being aligned accurately. Accordingly, the positioning device 102 performs preliminary positioning of the first substrate W1 and the second substrate W2 before those substrates W1 and W2 are supplied to the press machine 15. The positioned first substrate W1 and the second substrate W2 are transferred to the press machine 15 by the transfer robot.

Figure 3:
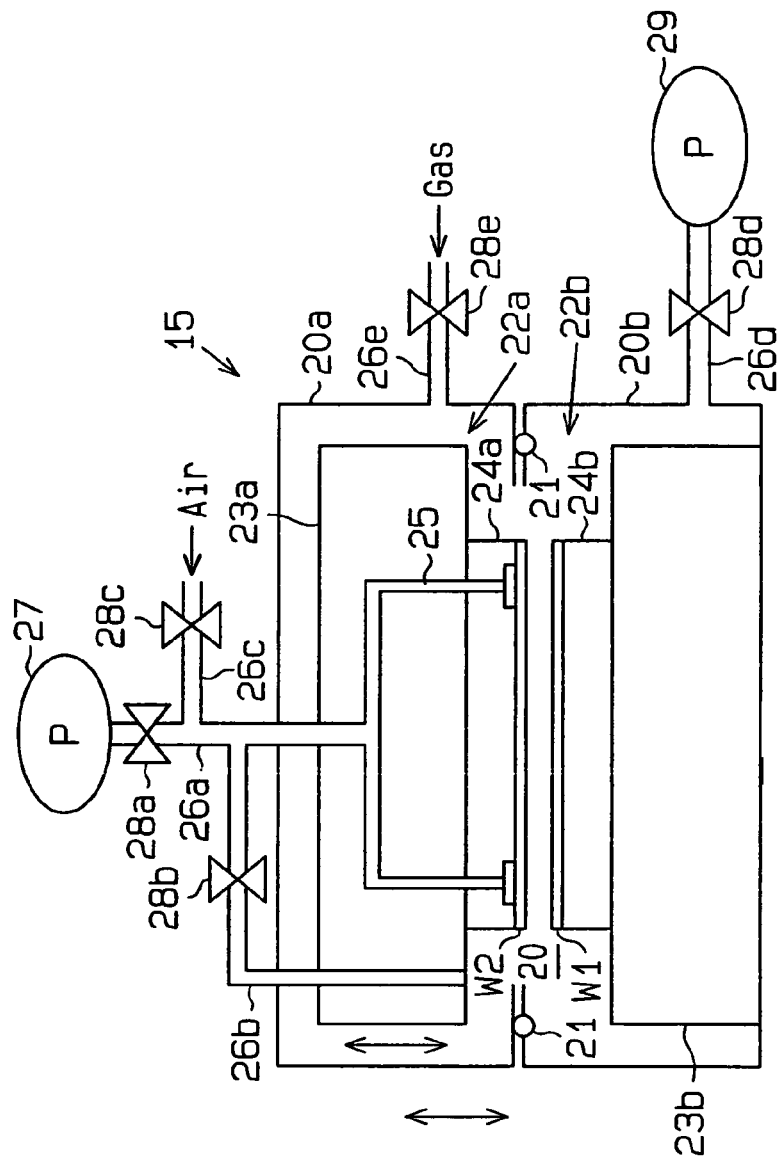
FIG. 3 shows the chuck mechanism of the press machine in FIG. 2.

The press machine 15 has a vacuum process chamber 20 (see FIG. 3). An upper chuck, or a press plate 24a, for chucking the second substrate (upper substrate) W2 and a lower chuck, or a table 24b, for chucking the first substrate (lower substrate) W1 are provided in the vacuum process chamber 20. The first substrate W1 and the second substrate W2 are simultaneously transferred to the press machine 15 and are separately held by the table 24b and the press plate 24a.

The press machine 15 evacuates the vacuum process chamber 20 and feeds a predetermined gas to the vacuum process chamber 20 to perform a preprocess on the substrates W1 and W2. The predetermined gas is a substitution gas including a reactive gas, such as an exciting gas for a plasma display panel (PDP), an inactive gas, such as a nitrogen gas, or clean dry air. In the preprocess, impurities and products which are adhered to the surfaces of the substrates W1 and W2 or the surfaces of display elements is exposed to the predetermined gas for a predetermined time. The preprocess stably maintains the property of the bonded surfaces which cannot be unsealed after bonding. In general, an oxide film is formed on the surfaces of the substrates W1 and W2 so that an airborne material in the air is adhered to the surfaces. This changes the states of the surfaces of the substrates W1 and W2. As the degree of a change in the surface state varies between the substrates W1 and W2, the qualities of the panels differ from one panel to another. In this respect, changes in the surfaces of the substrates W1 and W2 are suppressed by performing the preprocess which suppresses the formation of a film and the adhesion of an impurity and processes the adhered impurity.

The press machine 15 aligns the first substrate W1 with the second substrate W2, while optically detecting an alignment mark, in such a way that the sealing material and liquid crystal on the first substrate W1 do not contact the bottom surface of the second substrate W2. The press machine 15 presses the substrates W1 and W2 with a predetermined pressure in such a way as to ensure a predetermined cell thickness. After pressing, the press machine 15 releases the vacuum process chamber 20 to set the pressure in the vacuum process chamber 20 to the atmospheric pressure.

While monitoring the time passed from the point when the substrates W1 and W2 were transferred to the vacuum process chamber 20, the control unit 11 controls the time from the point of transfer to the point of bonding in such a way that the substrates W1 and W2 are exposed to the gas supplied to the vacuum process chamber 20 over a predetermined time. This stabilizes the bonded surfaces of the substrates W1 and W2 and allows the bonded surfaces to have a predetermined property.

The fourth transfer equipment 17d removes the bonded substrate (integrated substrate W1, W2 or liquid crystal panel) from the press machine 15 and transfers it to the curing device 16. When the time passed from the point at which the liquid crystal panel was pressed reaches a predetermined time, the control unit 11 drives the fourth transfer equipment 17d to supply the liquid crystal panel to the curing device 16.

The liquid crystal that has been sealed in the liquid crystal panel spreads between the substrates W1 and W2 by the pressing pressure and the atmospheric pressure. It is necessary to cure the sealing material before the liquid crystal reaches the frame of the sealing material. Therefore, the curing device 16 irradiates light having a predetermined wavelength to the liquid crystal panel to cure the sealing material after a predetermined time passes after pressing. The predetermined time is determined by acquiring the spreading time of the liquid crystal and the time needed to release the press stress remaining on the substrates W1 and W2 beforehand through experiments.

The press stress remains on the integrated substrate W1, W2. Because the sealing material is not cured while the substrates W1 and W2 are transferred to the fourth transfer equipment 17d, the stress remaining on the substrates W1 and W2 is released. As the stress hardly remains on the substrates W1 and W2 when the sealing material is cured, the generation of a positional deviation is reduced.

After the sealing material is cured, the fifth transfer equipment 17e transfers the liquid crystal panel from the curing device 16 to a device which executes the subsequent step. The subsequent step is, for example, an inspection step for inspecting the positional deviation between the first substrate W1 and the second substrate W2. The inspection result is fed back to the press machine 15 in order to correct the alignment of substrates to be pressed next.

The press machine 15 will be discussed in detail below.

Figure 2:
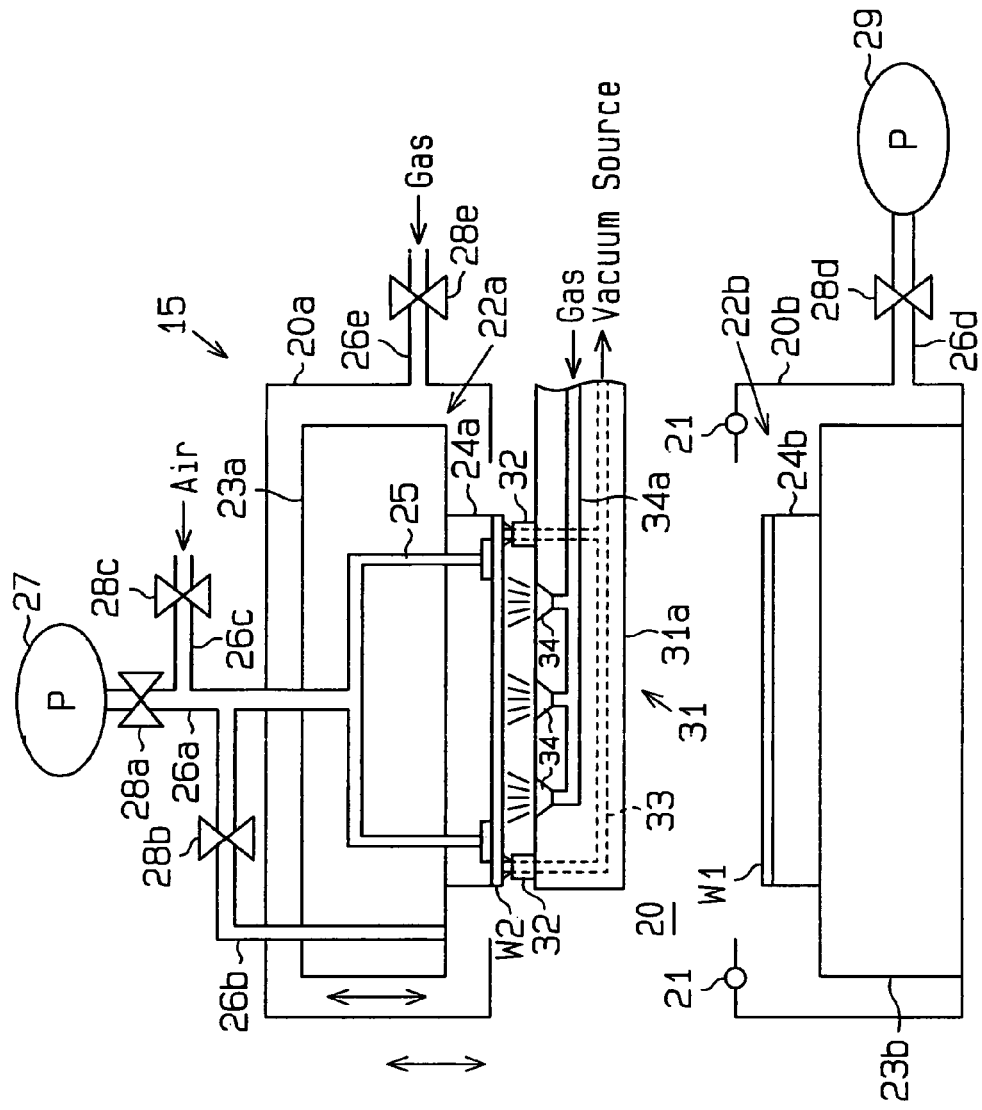
FIG. 2 is a schematic diagram of the chuck mechanism of a press machine according to a first embodiment of the present invention.

As shown in FIG. 2, the vacuum process chamber 20 is separated into an upper container 20a and a lower container 20b which are separable up and down.

The upper container 20a is supported by a lift mechanism (not shown) in such a way as to be movable up and down. As shown in FIG. 3, as the upper container 20a is moved down, the vacuum process chamber 20 is sealed tightly. A seal 21 provided at the top side of the lower container 20b seals between the upper container 20a and the lower container 20b.

Provided in the vacuum process chamber 20 are an upper holding plate 22a and a lower holding plate 22b which chuck the substrates W1 and W2, respectively. In the first embodiment, the second substrate W2 is chucked by the upper holding plate 22a and the first substrate W1 by the lower holding plate 22b. The upper holding plate 22a is supported by a lift mechanism (not shown) in such a way as to be movable up and down. The lower holding plate 22b is supported by an unillustrated drive mechanism in such a way as to be slidable along the horizontal plane (X axis and Y axis) and rotatable horizontally.

The upper holding plate 22a has an upper surface plate 23a, a press plate 24a or an electrostatic chuck portion mounted to the bottom surface of the upper surface plate 23a, and a vacuum line 25 for vacuum chucking of the second substrate W2. The vacuum line 25 includes a plurality of chuck holes opened in the bottom surface of the press plate 24a and a horizontal line communicated with the chuck holes and formed horizontally in the upper surface plate 23a.

The vacuum line 25 is connected to a first vacuum pump 27 via a main pipe 26a. The main pipe 26a is provided with a chuck valve 28a. The first vacuum pump 27 and the chuck valve 28a are connected to the control unit 11. The control unit 11 controls the driving of the vacuum pump 27 and the opening/closing of the valve 28a. An unillustrated pressure sensor is provided in the main pipe 26a.

The main pipe 26a is connected to a pipe 26b having an opening in the bottom surface of the upper surface plate 23a. The pipe 26b is provided with a back pressure release valve 28b. The opening/closing of the valve 28b is controlled by the control unit 11. As the valve 28b is opened, the pressure in the vacuum line 25 is approximately equalized to the pressure in the vacuum process chamber 20 and the back pressure of the second substrate W2.

The main pipe 26a is connected to an atmosphere pipe 26c. The atmosphere pipe 26c is provided with an atmosphere valve 28c. The opening/closing of the atmosphere valve 28c is controlled by the control unit 11. As the atmosphere valve 28c is opened, the air is led into the main pipe 26a via the atmosphere pipe 26c, making the back pressure of the second substrate W2 approximately equal to the atmospheric pressure.

The lower holding plate 22b has a lower surface plate 23b and an electrostatic chuck portion or the table 24b mounted to the top surface of the lower surface plate 23b. Although the lower holding plate 22b is not provided with a suction mechanism for vacuum chucking of the substrate W1, the lower holding plate 22b, like the upper holding plate 22a, may be provided with a chuck mechanism (pump 27, pipes 26a, 26b and 26c, and valves 28a, 28b and 28c).

The lower container 20b is connected via a depressurizing pipe 26d to a second vacuum pump 29 for depressurizing the vacuum process chamber 20. The depressurizing pipe 26d is provided with an exhaust valve 28d. The second vacuum pump 29 and the exhaust valve 28d are controlled by the control unit 11.

A gas pipe 26e for feeding the predetermined gas to the vacuum process chamber 20 is connected to the upper container 20a. The gas pipe 26e is provided with a gas inlet valve 28e whose opening/closing action is controlled by the control unit 11.

The control unit 11 drives the first vacuum pump 27 and opens the chuck valve 28a to evacuate the vacuum line 25 and the main pipe 26a and vacuum-chuck the second substrate W2. The control unit 11 electrostatically chucks the substrates W2 and W1 by Coulomb's force generated by applying a voltage to the press plate 24a and the table 24b.

The control unit 11 switches the chuck mode for the second substrate W2 to vacuum chuck or electrostatic chuck in accordance with the pressure (degree of vacuum) in the vacuum process chamber 20. At the time the second substrate W2 is transferred to the vacuum process chamber 20, for example, the control unit 11 causes the press plate 24a to hold the second substrate W2 by vacuum chuck (pressure differential). When the pressure in the vacuum process chamber 20 becomes lower than the pressure in the main pipe 26a (and the vacuum line 25), on the other hand, the control unit 11 closes the chuck valve 28a to disconnect the vacuum line 25 from the vacuum pump 27 and causes the press plate 24a to hold the second substrate W2 by electrostatic force.

Next, a step of carrying the substrates W1 and W2 into the press machine 15 will be discussed by referring to FIG. 2. In the following description, the surfaces to be bonded, i.e., the surfaces that contact the liquid crystal (the top surface of the first substrate W1 and the bottom surface of the second substrate W2) are called "inner surfaces" and the opposite surfaces (the bottom surface of the first substrate W1 and the top surface of the second substrate W2) are called "outer surfaces".

The second substrate W2 is vacuum-chucked by the transfer robot 31 and is carried into the press machine 15. The transfer robot 31 has a holding member including a mechanism to chuck the second substrate W2 or a hand 31a.

The hand 31a of the transfer robot 31 has a plurality of chuck pads 32 for chucking the outer edge area of the inner surface of the second substrate W2 (the portion between the frame of the sealing material and the edge of the substrate). The chuck pads 32 are connected to an unillustrated vacuum source via a chuck line 33 formed in the hand 31a.

The hand 31a has at least one gas injection nozzle 34 provided in such a way as to face a portion inward of the outer edge area of the inner surface of the second substrate W2. The gas injection nozzle 34 is connected to a gas supply source (not shown) via a gas supply line 34a formed in the hand 31a and an unillustrated pipe, so that the gas fed from the gas supply source is injected toward the inner surface of the second substrate W2 from the gas injection nozzle 34.

The gas injection amount (flow rate) is set in such a way as to generate a pressure equivalent to the weight of the second substrate W2 per unit area. The setting is carried out by first estimating the gas injection amount based on the area, thickness and specific gravity of the second substrate W2, the pitch between the gas injection nozzles 34 and the distance between the nozzles 34 and the inner surface of the second substrate W2, and then confirming the amount through experiments. As the bending of the second substrate W2 by the dead load is prevented by the gas injection pressure, the second substrate W2 is held by the transfer robot 31 in an approximately horizontal state.

The gas to be spouted on the second substrate W2 is, for example, the aforementioned reactive gas, nitrogen gas or dean dry air. As the inner surface of the second substrate W2 is exposed to such a gas, an impurity or product adhered to the second substrate W2 is removed.

The transfer robot 31 causes the second substrate W2 to approach the chuck surface of the press plate 24a while keeping the second substrate W2 in a flat state. The press plate 24a holds the second substrate W2 by effecting at least one of suction and electrostatic force.

A description will now be given of the transfer of the substrate W1 (the substrate held on the table 24b).

The substrate W1 is carried into the press machine 15 while being chucked and held by another hand (not shown in FIG. 2) of the transfer robot 31.

The table 24b is provided with known lift pins (not shown) that are supported in a vertically movable manner. The substrate W1 transferred by the transfer robot 31 is received by a plurality of lift pins elevated, and is placed on the table 24b as the lift pins are moved downward. As electrostatic force is let to work on the substrate W1 from the table 24b in that state, the substrate W1 is held on the table 24b.

The press plate 24a will be discussed next.

Figure 4C:
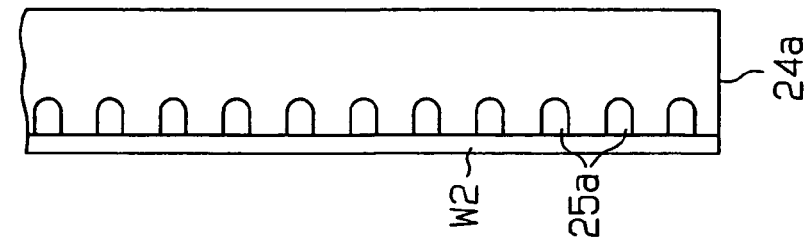
FIGS. 4A, 4B and 4C show the chuck surface of a press plate.
Figure 4A:
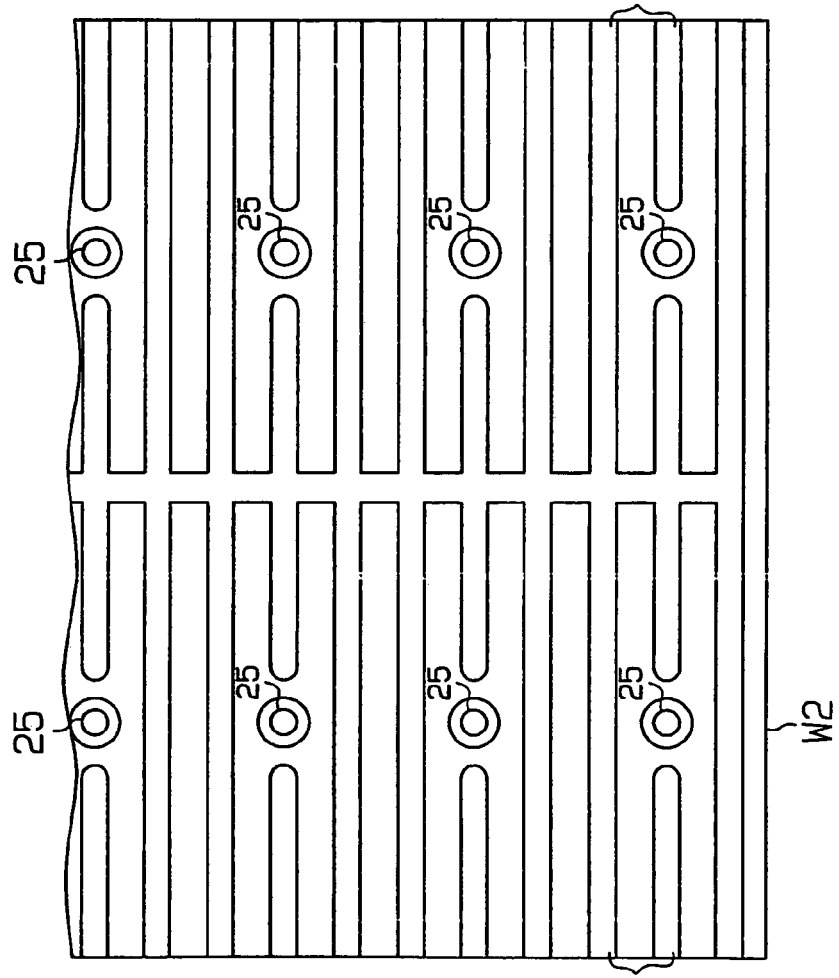
Figure 4B:
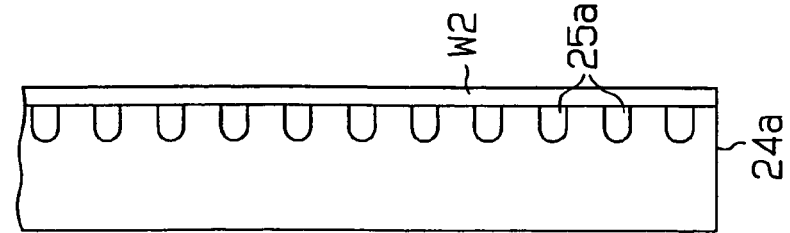

As shown in FIG. 4B, a plurality of grooves 25a are formed in the chuck surface of the press plate 24a at predetermined pitches. With the second substrate W2 held by the press plate 24a, the grooves 25a do not communicate with the vacuum line 25. The grooves 25a extend to the end face (side surface) of the press plate 24a along a predetermined direction (see FIGS. 4A and 4C).

Bubbles that remain between the press plate 24a and the second substrate W2 at the time of depressurizing the vacuum process chamber 20 are moved into the vacuum process chamber 20 via the grooves 25a. This prevents the bubbles from remaining between the press plate 24a and the second substrate W2 at the time of depressurizing the vacuum process chamber 20 and thus prevents the second substrate W2 from moving and coming off.

The grooves 25a make the contact area between the chuck surface and the second substrate W2 smaller. When the stress stored on the second substrate W2 is released, therefore, the position of the second substrate W2 is prevented from being deviated.

Grooves similar to the grooves 25a of the press plate 24a are likewise formed on chuck surface of the table 24b. Therefore, the substrate W1 is held in a flat state and in contact with the press plate 24a, thus preventing the movement and separation of the substrate W1.

Figure 5:
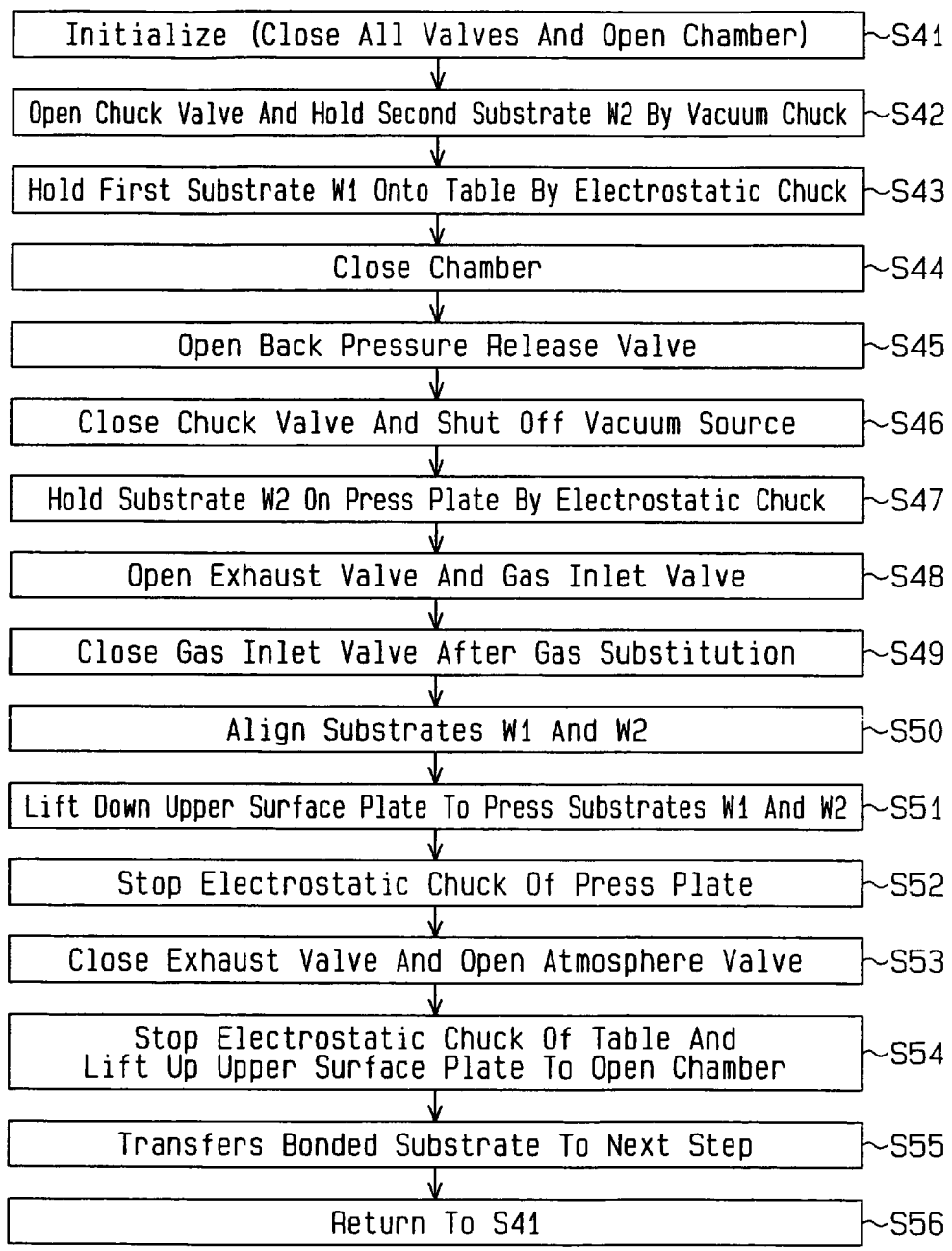
FIG. 5 is a flowchart of a bonding method.

Referring now to FIG. 5, a method of bonding the substrates W1 and W2 will be discussed.

In step S41, the press machine 15 is initialized. That is, the valves 28a to 28e are all closed and the upper container 20a is moved upward to open the vacuum process chamber 20. The first and second vacuum pumps 27 and 29 normally driven.

In an unillustrated step, the frame of the sealing material (adhesive) is formed on the first substrate W1 beforehand and a liquid crystal is dropped on the surface of the first substrate W1 defined by the frame. The substrates W1 and W2 are transferred to the initialized press machine 15 by the transfer robot 31. Specifically, the transfer robot 31 places the second substrate W2 close to the press plate 24a while holding the substrate W2 in an approximately horizontal state. In step S42, the press machine 15 opens the chuck valve 28a to allow the press plate 24a to hold the second substrate W2 by vacuum chuck. In step S43, the transfer robot 31 places the first substrate W1 onto the table 24b. In step S43, the press machine 15 applies a predetermined voltage to the table 24b. This causes the substrate W1 to be electrostatically held on the table 24b.

In step S44, the press machine 15 lifts down the upper container 20a of the vacuum process chamber 20 to close the vacuum process chamber 20. In step S45, the press machine 15 opens the back pressure release valve 28b. This allows the vacuum line 25 and the main pipe 26a to communicate with the interior of the vacuum process chamber 20 via the pipe 26b, so that the back pressure of the second substrate W2 (the pressure in the vacuum line 25) becomes approximately equal to the pressure in the vacuum process chamber 20 (chamber pressure). That is, the pressure on the inner surface side of the second substrate W2 becomes approximately equal to the pressure on the outer surface side. This prevents the second substrate W2 from locally bent by the pressure differential between the top and bottom surfaces of the second substrate W2, so that the second substrate W2 can be stably held on the press plate 24a in an approximately flat state.

In step S46, the press machine 15 closes the chuck valve 28a. While this releases the suction force acting on the second substrate W2, the second substrate W2 does not come off the press plate 24a soon. This is because the outer surface of the second substrate W2 and the chuck surface of the press plate 24a are almost flat and moisture contained in the air is intervened between the press plate 24a and the second substrate W2, so that adhesion strength remains between the press plate

24*a* and the second substrate W2. In step S47, the press machine 15 applies a voltage to the press plate 24*a* to electrostatically chuck the second substrate W2 within a period during which the second substrate W2 is held on the press plate 24*a* by the adhesion strength.

In step S48, the press machine 15 opens the exhaust valve 28*d* and the gas inlet valve 28*e*. As a result, substitution with an inactive gas is carried out while the vacuum process chamber 20 is depressurized by the vacuum pump 29. Because the second substrate W2 is electrostatically chucked to the press plate 24*a* in an approximately flat state during depressurization of the vacuum process chamber 20, bubbles hardly remain on the contact surface between the second substrate W2 and the press plate 24*a*. This suppresses the generation of a glow discharge, thus preventing the positional deviation and separation of the second substrate W2.

After a predetermined time elapses, gas substitution in the vacuum process chamber 20 is completed. In step S49, the press machine 15 closes the gas inlet valve 28*e* after the gas substitution is completed. In step S50, the press machine 15 optically detects an alignment mark and aligns the first and second substrates W1 and W2 with each other in such a way that the sealing material on the substrate W1 and the liquid crystal do not contact the bottom surface of the substrate W2.

In step S51, the press machine 15 lifts down the upper surface plate 23*a* and applies a predetermined pressure to the substrates W1 and W2 to press the substrates W1 and W2 to a predetermined cell thickness and bond the substrates W1 and W2 together in vacuum.

After bonding of the substrates W1 and W2, the press machine 15 stops electrostatic chuck of the press plate 24*a* in step S52. In step S53, the press machine 15 closes the exhaust valve 28*d* to open the atmosphere valve 28*c*. As a result, the pressure in the vacuum process chamber 20 becomes the atmospheric pressure.

In step S54, the press machine 15 stops electrostatic chuck of the table 24*b* and lifts the upper surface plate 23*a* upward. The integrated substrate W1, W2 remains on the table 24*b*. The press machine 15 moves the upper container 20*a* to the upper end to open the vacuum process chamber 20.

In step S55, the transfer robot 31 removes the integrated substrate W1, W2 from the table 24*b* and transfers it to the device that executes the subsequent step. In step S56, the process returns to step S41.

As the local bending of the second substrate W2 is corrected and the second substrate W2 is held on the press plate 24*a* in an approximately flat state by the electrostatic force according to the bonding method in FIG. 5, the positional deviation and separation of the second substrate W2 are prevented during depressurization of the vacuum process chamber 20.

Figure 6:
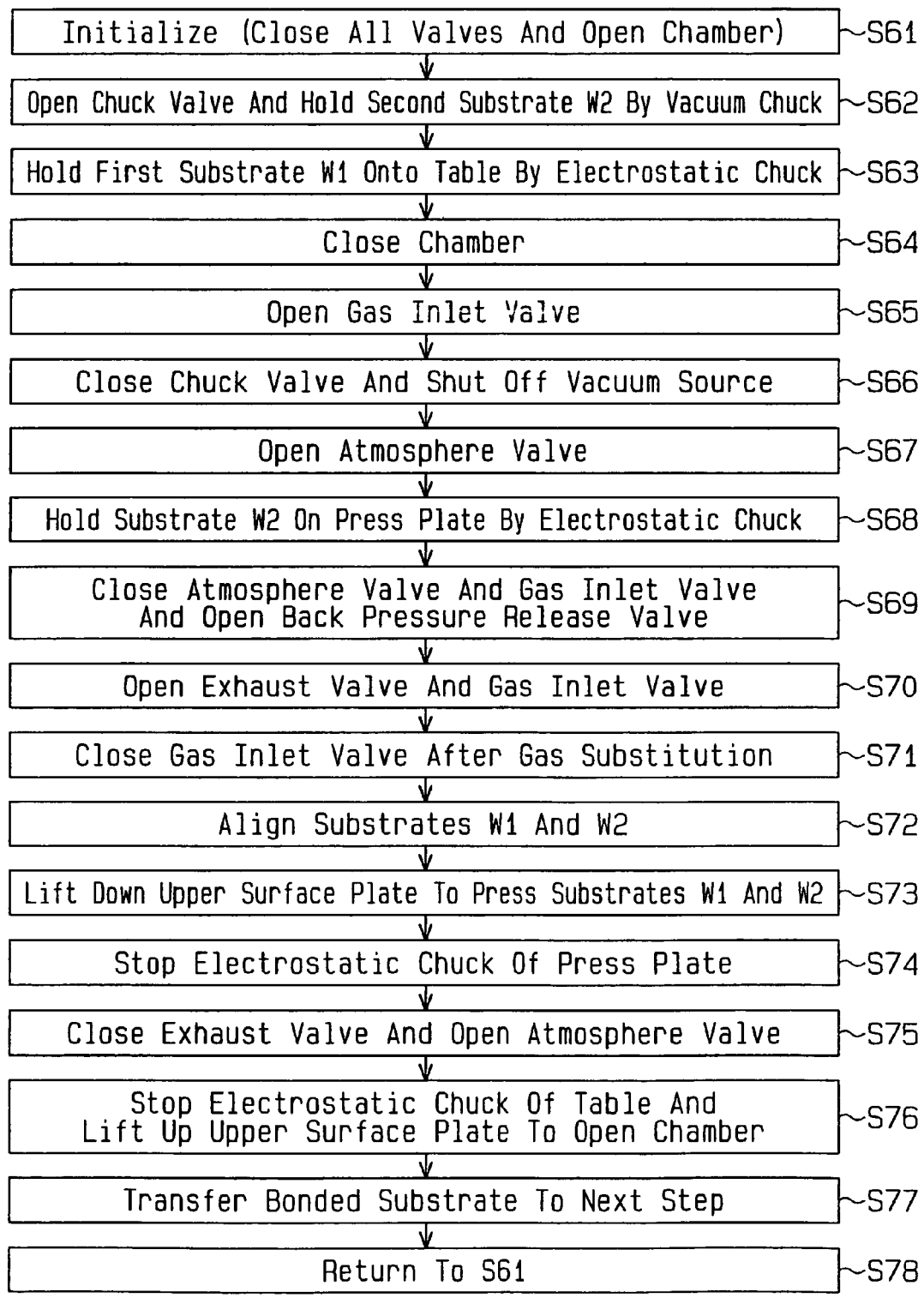
FIG. 6 is a flowchart of another bonding method.

The bonding method in FIG. 5 may be modified as illustrated in FIG. 6.

Steps S61 to S64 in FIG. 6 are the same as steps S41 to S44 in FIG. 5. That is, after initialization of the press machine 15, the second substrate W2 is held on the press plate 24*a*, the substrate W1 is held on the table 24*b* and the vacuum process chamber 20 is closed.

In step S65, the press machine 15 opens the gas inlet valve 28*e* to let the gas enter the vacuum process chamber 20. This raises the chamber pressure to, for example, the atmospheric pressure+2 kPa (kilo pascals).

The press machine 15 stops evacuation of the vacuum process chamber 20 by closing the chuck valve 28*a* (step S66) and opens the atmosphere valve 28*c* to set the pressures in the main pipe 26*a* and vacuum line 25 to the atmospheric pressure (step S67).

At this time, as the gas inlet valve 28*e* is open, the gas is fed into the vacuum process chamber 20 so that the chamber pressure is higher than the atmospheric pressure. Therefore, the second substrate W2 is held on the press plate 24*a* by the pressure differential between the chamber pressure and the atmospheric pressure. The pressure differential is controlled in such a way as to become a level which is sufficient to hold the second substrate W2 on the press plate 24*a* (e.g., the chamber pressure=atmospheric pressure+2 kPa). Accordingly, the local bending of the second substrate W2 is suppressed so that the second substrate W2 is stably fixed on the press plate 24*a* in an approximately flat state.

The press machine 15 applies a voltage to the press plate 24*a* to allow the press plate 24*a* to electrostatically hold the second substrate W2 (step S68) and closes the atmosphere valve 28*c* and the gas inlet valve 28*e* to open the back pressure release valve 28*b* (step S69). Opening the back pressure release valve 28*b* eliminates the pressure differential between the top and bottom surfaces of the second substrate W2, thus preventing the occurrence of local bending of the second substrate W2 and the positional deviation and separation of the second substrate W2.

In step S70, the press machine 15 opens the exhaust valve 28*d* and the gas inlet valve 28*e*. Consequently, the vacuum process chamber 20 is evacuated by the vacuum pump 29 and gas substitution is carried out. At this time, the second substrate W2 is electrostatically chucked to the press plate 24*a* in an approximately flat state and bubbles hardly remain on the contact surface of the second substrate W2 and the press plate 24*a*. This suppresses the generation of a glow discharge, thus preventing the positional deviation and separation of the second substrate W2.

In step S71, the press machine 15 closes the gas inlet valve 28*e* after gas substitution in the vacuum process chamber 20 is completed. Steps S72 to S78 are the same as steps S50 to S55 in FIG. 5.

According to the bonding method in FIG. 6, bending of the second substrate W2 is prevented and positional deviation and separation of the second substrate W2 are prevented in a period during which the vacuum process chamber 20 is evacuated. While the vacuum chuck of the second substrate W2 is stopped and the second substrate W2 is electrostatically held, the second substrate W2 is pressed on the press plate 24*a* and stably held by the pressure differential originated from the supply of the gas. Further, the method allows the gas to efficiently remove impurities in the vacuum process chamber 20 and on the inner surface of the second substrate W2.

A description will now be given of local bending of the second substrate W2.

Figure 7A:
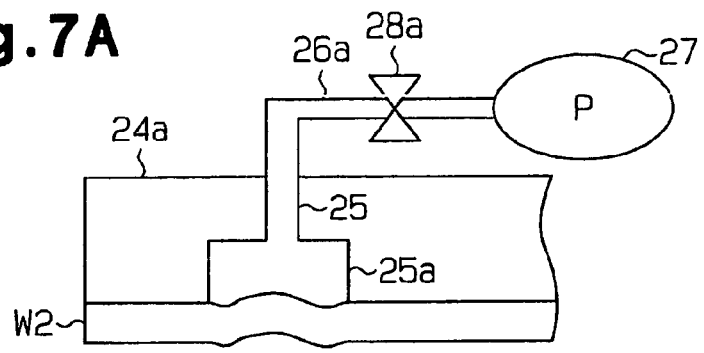
FIG. 7A is an enlarged view of a locally bent substrate.
Figure 7B:
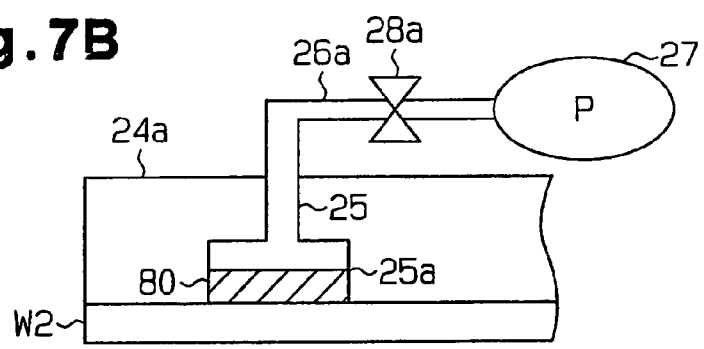
FIG. 7B is an enlarged view of a substrate whose local bending is prevented.

When the press plate 24*a* holds the second substrate W2 by suction, local bending occurs as shown in FIG. 7A due to the pressure differential between the top and bottom surfaces of the second substrate W2. The thinner the second substrate W2 is, the more prominent the bending originated from the pressure differential becomes.

To prevent local bending, it is preferable to provide a porous member 80 of porous ceramics or the like which has, for example, a permeability in the grooves 25*a*. Providing the porous member 80 in the grooves 25*a* improves the rigidity of the chuck surface and makes the chuck surface flat, thus preventing local bending of the second substrate W2. In the bonding step of the substrates W1 and W2, the effect of preventing positional deviation and separation of the second substrate W2 from the press plate 24*a* due to the bending of the second substrate W2 is further improved.

To prevent a waste from being stored inside the porous member 80 and contaminating the second substrate W2, it is desirable to eliminate dust or the like by regular counterflow of a gas (inactive gas).

A description will now be given of a method of removing impurities from the press plate 24a and table 24b.

Impurities, such as dust or glass pieces of the substrates W1 and W2, are apt to be adhered to the press plate 24a and the table 24b. The impurities may damage the chuck surfaces of the press plate 24a and table 24b or may cause positional deviation and separation of the substrates W1 and W2 at the time of chucking the substrates W1 and W2. It is therefore necessary to eliminate the impurities adhered to the press plate 24a and table 24b.

Figure 8:
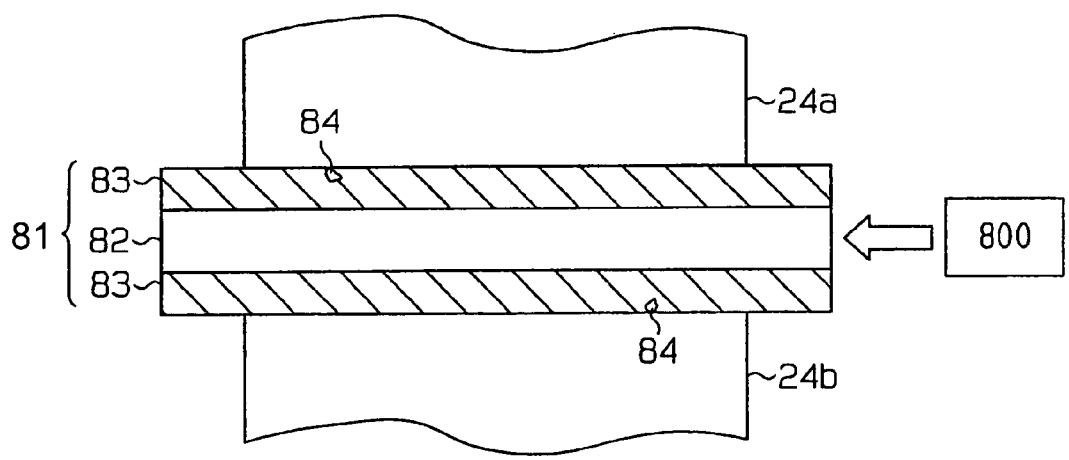
FIG. 8 is a diagram for explaining elimination of an impurity by using an adhesive sheet.

FIG. 8 shows an adhesive sheet 81 which comprises a tape base 82 and an adhesive layer 83 formed by applying an adhesive to both sides of the tape base 82. Impurities 84, such as dust or glass pieces, adhered to the press plate 24a and table 24b are removed by using the adhesive sheet 81. Specifically, first, an impurity eliminating device (sheet feeder) 800 feeds the adhesive sheet 81 into the press machine 15 and adheres the adhesive sheet 81 to the chuck surface of the table 24b.

The press machine 15 tightly closes the vacuum process chamber 20 and opens the exhaust valve 28d to evacuate the vacuum process chamber 20. After the vacuum process chamber 20 is depressurized to a predetermined pressure (almost vacuum), the upper surface plate 23a is lifted down to the position where the press plate 24a comes in close contact with the adhesive sheet 81. The exhaust valve 28d is closed and the gas inlet valve 28e is opened to set the chamber pressure nearly to the atmospheric pressure. With the vacuum process chamber 20 opened, the upper surface plate 23a is lifted upward so that the adhesive sheet 81 on the table 24b is separated by the transfer mechanism.

According to the impurity removing method, the adhesive sheet 81 is adhered to the press plate 24a and table 24b evenly and firmly in vacuum and the impurities 84, such as dust or glass pieces, find their way into the adhesive layer 83. Therefore, even minute dust is effectively removed from the chuck surface.

The elasticity of the tape base 82 allows dust or the like to be removed from the chuck surfaces of the press plate 24a and table 24b without damaging the chuck surfaces.

To enhance the impurity removing effect, it is preferable to execute the method with the vacuum process chamber 20 depressurized. The method may however be executed in the atmospheric pressure in which case, the time to depressurize the vacuum process chamber 20 is shortened and a certain degree of an impurity removing effect is acquired.

Instead of sandwiching the adhesive sheet 81 between the press plate 24a and table 24b, the adhesive sheet 81 may be adhered to each of the press plate 24a and table 24b and be separated therefrom later. In case where the adhesive layer 83 is applied only to one side of the tape base 82, the impurities adhered to the press plate 24a and table 24b may be removed alternately in an arbitrary order or the adhesive sheet 81 may be adhered to the press plate 24a and table 24b individually.

In a case where the press plate 24a and table 24b are detachable from the press machine 15, impurities may be removed by the adhesive sheet 81 outside the vacuum process chamber 20 (outside the bonded-substrate fabricating apparatus 10).

The amount of a liquid crystal to be sealed between the substrates W1 and W2 will be discussed below.

Because two substrates W1 and W2 should be bonded together with an extremely small gap (cell thickness), it is necessary to adjust the amount of a liquid crystal to be sealed to the adequate amount.

Figure 9:
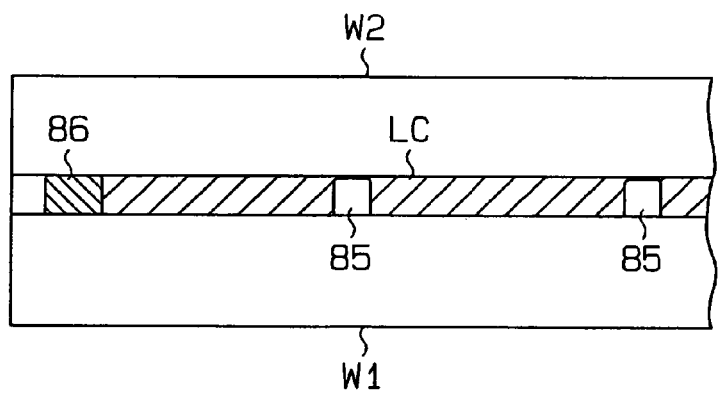
FIG. 9 shows bonded substrates between which a liquid crystal is sealed.

As shown in FIG. 9, a plurality of spacers or poles 85 for restricting the gap (cell thickness) between the substrates W1 and W2 to a predetermined value are formed on one substrate (the array substrate W1 on which the liquid crystal is to be dropped in the first embodiment). After a liquid crystal LC is dropped within the frame of a sealing material 86, the substrates W1 and W2 are bonded together.

The height of the poles 85 (pole height) may vary from a predetermined value. The variation in pole height causes the gap between the substrates W1 and W2 to change from its predetermined value. It is therefore necessary to adjust the dropping amount of the liquid crystal LC in accordance with the pole height before bonding the substrates W1 and W2. The adjustment of the dropping amount of the liquid crystal LC will be described below referring to FIG. 10.

Figure 10:
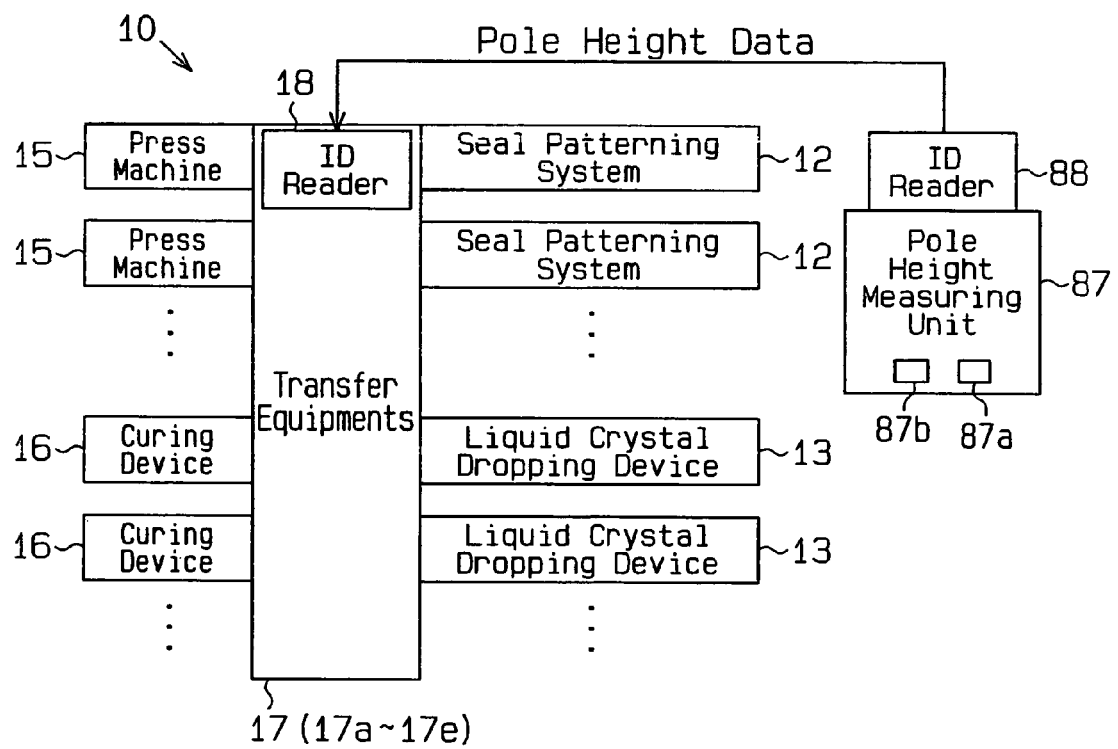
FIG. 10 is a block diagram of a control method for the amount of the liquid crystal.

FIG. 10 shows the bonded-substrate fabricating apparatus 10 which is equipped with a plurality of seal patterning systems 12, a plurality of liquid crystal dropping devices 13, a plurality of press machines 15 and a plurality of curing devices 16. The ID reader 18 is provided in the first transfer equipment 17a.

A pole height measuring unit 87 is connected to the bonded-substrate fabricating apparatus 10 via a network. The pole height measuring unit 87 measures the height of the poles 85 formed on one of the substrates W1 and W2 (e.g., the array substrate W1). The measuring unit 87 has an ID reader 88 for reading a substrate ID to distinguish the types of the substrates W1 and W2.

In step S91a in FIG. 11A, the ID reader 88 reads the substrate ID of the substrate W1. In step S92a, the pole height measuring unit 87 measures the height of the poles 85 formed on the substrate W1. In step S93a, the pole height measuring unit 87 stores the measuring result or pole height information in a first memory device 87a in the pole height measuring unit 87 in association with the substrate ID. The pole height measuring unit 87 performs steps S91a to S93a in advance before the substrate W1 is transferred to the bonded-substrate fabricating apparatus 10.

As shown in FIG. 11B, when the first transfer equipment 17a receives the substrates W1 and W2, the control unit 11 (see FIG. 1) causes the ID reader 18 to read the substrate ID of the substrate W1 (step S91b). Specifically, the first transfer equipment 17a reads the substrate ID of the substrate W1 having the poles 85 and transfers the substrates W1 and W2 to the associated seal patterning system 12 in accordance with an instruction from the control unit 11.

The control unit 11 reads the pole height information associated with the substrate ID of the substrate W1 from the first memory device 87a and stores the pole height information into a second memory device 87b in the control unit 11 (step S92b). Based on the pole height information, the control unit 11 determines the liquid crystal dropping device 13 that drops the liquid crystal LC (step S93b). In a case where the bonded-substrate fabricating apparatus 10 is provided with only one type of liquid crystal dropping device 13, step S93b is omitted and the second transfer equipment 17b transfers the substrates W1 and W2 from the seal patterning system 12 to that liquid crystal dropping device 13.

In step S94b, the control unit 11 computes the dropping amount of the liquid crystal LC. Specifically, a correction value for correcting an error in the dropping amount of the liquid crystal LC among a plurality of liquid crystal dropping devices 13 is set beforehand for each liquid crystal dropping device 13. The control unit 11 computes the proper dropping amount of the liquid crystal LC based on the dropping amount of the liquid crystal LC for the pole height information acquired beforehand through experiments and the correction value for the dropping amount.

The control unit 11 instructs the proper dropping amount of the liquid crystal LC to the liquid crystal dropping device 13 (step S95*b*) and the liquid crystal dropping device 13 drops the proper dropping amount of the liquid crystal LC onto the substrate W1 (step S96*b*).

According to the control method in FIGS. 11A and 11B, the dropping amount of the liquid crystal LC is corrected in accordance with the pole height of the poles 85 formed on the substrate W1 and which liquid crystal dropping device 13 was used. This reduces the rate of defects of the integrated substrates W1, W2, thus reducing the wasteful amount of the liquid crystal LC in use.

The serial number information of the pole height measuring unit 87 that has measured the pole height may be added to the substrate ID and the pole height information and stored in the first memory device 87*a*.

In some cases, the bonded-substrate fabricating apparatus 10 may have a plurality of pole height measuring units 87 for the purpose of mass production and stable operation or the like. In such a case, there is a possibility that an error occurs in the measured value of the pole height due to a variation in the pole height measuring units 87. It is therefore important to grasp which pole height measuring unit 87 has been used to measure the pole height information of the substrate W1. Adding the serial number information of the pole height measuring unit 87 to the substrate ID and the pole height information ensures computation of the proper dropping amount of the liquid crystal LC in consideration of variations in the pole height measuring units 87 and the liquid crystal dropping devices 13.

A lot number may be added to the substrate ID and the pole height information and stored in the first memory device 87*a*. The lot number is a number to be given to a predetermined number of substrates W1 which are processed in a predetermined process unit period. Since the pole height information of the substrates W1 that have the same lot number can be acquired at a time according to the method, it is possible to calculate the dropping amount of the liquid crystal on the substrates W1 having the same lot number beforehand. This can eliminate the trouble of calculating the dropping amount of the liquid crystal for each substrate, so that the response time of the control unit 11 can be shortened and the productivity can be improved.

The first embodiment has the following advantages.

(1) While a gas is injected toward the inner surface of the second substrate W2, the second substrate W2 is transferred to the press machine 15 and held on the press plate 24*a* by the transfer robot 31 which chucks and holds the outer edge area of the inner surface or a transfer robot 31 that chucks and holds the outer edge area of the outer surface of the second substrate W2. Therefore, even the second substrate W2 which is likely to be bent due to the dead load is held on the press plate 24*a* while being kept horizontally. As the second substrate W2 is stably held on the press plate 24*a*, the positional deviation of the second substrate W2 on the press plate 24*a*, the separation of the second substrate W2 from the press plate 24*a* and the generation of a glow discharge at the time of performing electrostatic chuck are prevented. This results in improvements on the production yield and productivity of large and thin LCD panels.

(2) As the back pressure of the second substrate W2 is kept approximately equal to the pressure in the vacuum process chamber 20, local bending of the second substrate W2 originated from the pressure differential between the top and bottom surfaces of the second substrate W2 is prevented. Further, the movement or separation of the second substrate W2 is prevented due to bubbles remaining on the contact surface between the chuck surface of the press plate 24*a* and the second substrate W2, during depressurization of the vacuum process chamber 20.

(3) A plurality of grooves 25*a* are formed at predetermined pitches in the chuck surface of the press plate 24*a* with the end face (side) of the press plate 24*a* being cut away. Accordingly, the movement or separation of the second substrate W2, originated from even if bubbles remain on the contact surface been the press plate 24*a* and the second substrate W2, the bubbles become easier to move into the vacuum process chamber 20 during depressurization of the vacuum process chamber 20. Therefore, the movement or separation of the second substrate W2 or the like originated from the influence (expansion or the like) of the bubbles is prevented too.

(4) The porous member 80 having a permeability is provided in the grooves 25*a* of the press plate 24*a*. This structure surely prevents the local bending of the second substrate W2 originated from the pressure differential between the top and bottom surfaces of the second substrate W2 at the time of sucking the second substrate W2. This advantage can further enhance the advantage (2).

(5) Impurities, such as dust or glass pieces, adhered to the press plate 24*a* and the table 24*b* are removed by the adhesive sheet 81. As the adhesive sheet 81 is adhered to the press plate 24*a* and table 24*b* evenly and firmly in vacuum in the present embodiment, those impurities are effectively removed.

(6) The pole height measuring unit 87 measures the height of the poles 85 of the substrate W1. The optimal dropping amount of the liquid crystal LC which is corrected in accordance with the pole height information and the liquid crystal dropping device 13 that drops the liquid crystal LC is dropped on the substrate W1. This can reduce the rate of defects of the integrated substrates W1, W2 and the wasteful amount of the liquid crystal LC in use. By adding the serial number information of the pole height measuring unit 87 that has measured the pole height and a lot number to the pole height information, the dropping amount of the liquid crystal LC can be corrected more accurately and more efficiently. As the amount of the liquid crystal LC to be sealed is optimized, the yield of the liquid crystal panels is improved, thus making it possible to cope with products with a narrow substrate gap.

The following will discuss a transfer robot 101 and a method of fabricating a bonded substrate according to the second embodiment of the invention. As like or same reference numerals are given to those components which are the same as the corresponding components of the first embodiment that has been described earlier with reference to FIG. 2, their detailed descriptions will be partly omitted.

FIG. 12 shows the layout of the bonding device 14 (the curing device 16 not illustrated). The transfer robot 101 is provided between the positioning device 102 which carries out positioning of the first substrate W1 and the second substrate W2, the press machine 15 which carries out a bonding work and a disposing position 103 and is swingable to positions that respectively face the positioning device 102, the press machine 15 and the disposing position 103.

In the first bonding step for the substrates W1 and W2, it is necessary to transfer three types of parts (first substrate W1, second substrate W2 and integrated substrate W1, W2). To improve the fabrication efficiency of a bonded substrate, an improvement of the transfer efficiency for those three types of parts is demanded.

Figure 13A:
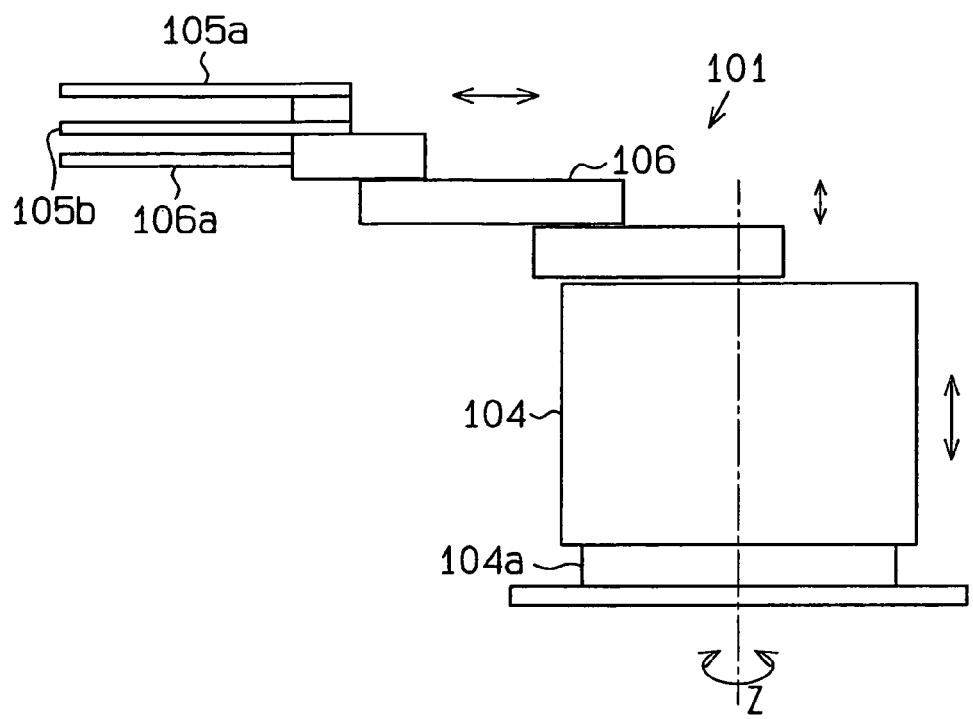
FIG. 13A is a schematic diagram of the transfer robot in FIG. 12.

The transfer robot 101 has a rotary portion 104, a first transfer arm 105 and a second transfer arm 106. As shown in FIG. 13A, the rotary portion 104 is provided in such a way as to be rotatable approximately 360 degrees about a body 104*a* and movable up and down along the axis (Z axis) of the body 104*a*. The first and second transfer arms 105 and 106 are individually extensible and contractible horizontally (directions of the X axis and Y axis) with respect to the rotary portion 104 and are slightly movable up and down in the Z-axial direction.

Therefore, the transfer robot 101 swings to each of the positions of the positioning device 102, the press machine 15 and the disposing position 103 and extends or contracts at least one of the first and second transfer arms 105 and 106 to transfer the substrates W1 and W2.

Figure 13B:
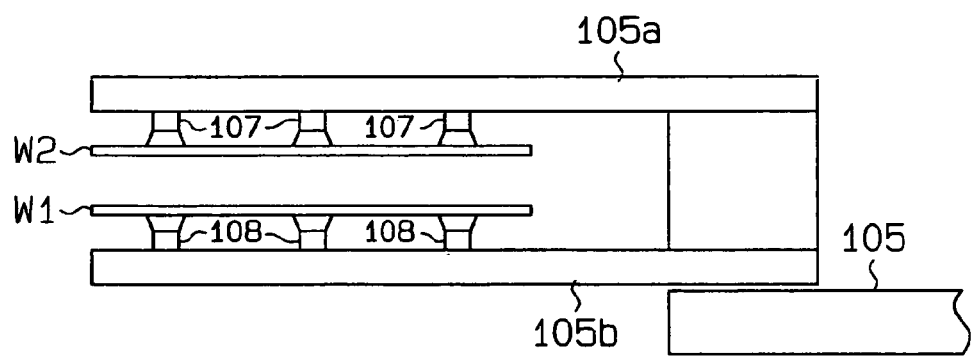
FIGS. 13B and 13C are enlarged views of hands of the transfer robot in FIG. 12.

As shown in FIG. 13B, holding members or first and second hands 105*a* and 105*b* are provided at the distal end of the first transfer arm 105. A plurality of chuck pads 107 are provided on the bottom surface of the first hand 105*a*. The chuck pads 107 hold the second substrate W2. Specifically, the chuck pads 107 suck the outer surface of the second substrate W2 by means of an unillustrated vacuum source. A plurality of chuck pads 108 are provided on the top surface of the second hand 105*b*. The plurality of chuck pads 108 suck the outer surface of the first substrate W1.

Figure 13C:
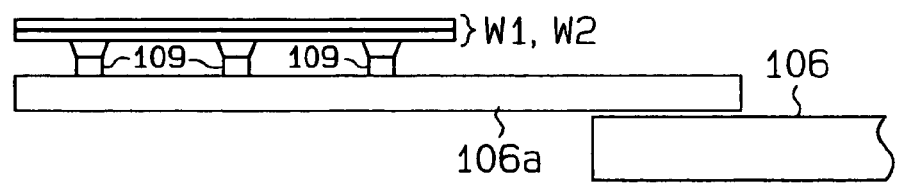

As shown in FIG. 13C, a holding member or a third hand 106*a* is provided at the distal end of the second transfer arm 106. A plurality of chuck pads 109 are provided on the top surface of the third hand 106*a*. The chuck pads 109 suck the integrated substrate W1, W2.

The transfer robot 101 first swings to the position facing the positioning device 102, holds one of the positioned substrates (second substrate W2) with the first hand 105*a* and takes out the substrate W2 from the positioning device 102. Next, the transfer robot 101 holds the other positioned substrate (first substrate W1) with the second hand 105*b* and takes out the substrate W1 from the positioning device 102. Those manipulations are carried out while the press machine 15 is bonding the previous substrates W1 and W2.

Next, the transfer robot 101 swings to the position facing the press machine 15. When the press machine 15 completes bonding the previous substrates W1 and W2, the transfer robot 101 holds the integrated substrate W1, W2 with the third hand 106*a* and takes out the integrated substrate W1, W2 from the press machine 15. Subsequently, the transfer robot 101 transfers the substrates W2 and W1, respectively held by the first and second hands 105*a* and 105*b*, to the press machine 15.

Thereafter, the transfer robot 101 swings to the position facing the disposing position 103 and disposes the integrated substrate W1, W2 held by the third hand 106*a* in the disposing position 103.

As apparent from the above, the transfer robot 101 performs a swing operation from the positioning device 102 to the disposing position 103, a single extensible and contractible operation of the first transfer arm 105 to transfer a set of substrates W1 and W2 to the press machine 15 and a single extensible and contractible operation of the second transfer arm 106 to transfer the integrated substrate W1, W2 from the press machine 15. That is, the transfer robot 101 can transfer a set of substrates W1 and W2 by a single swing operation and two extensible and contractible operations.

By way of contrast, the first transfer arm of the conventional transfer robot has the first hand (singular) and the second transfer arm has the second hand (singular). Therefore, the conventional transfer robot needs to perform two swing operations from the positioning device 102 and a total of three extensible and contractible operations of the first and second transfer arms for carrying the substrates W1 and W2 into/out of the press machine 15 at the time of executing a single transfer of the substrates W1 and W2 to the press machine 15. Because the use of the transfer robot 101 in FIG. 13A reduces the number of operations, the transfer time of substrates is shortened, which can thus shorten the time in which the operation of the press machine 15 is stopped. The transfer robot 101 therefore ensures an efficient transfer work.

Figure 15A:
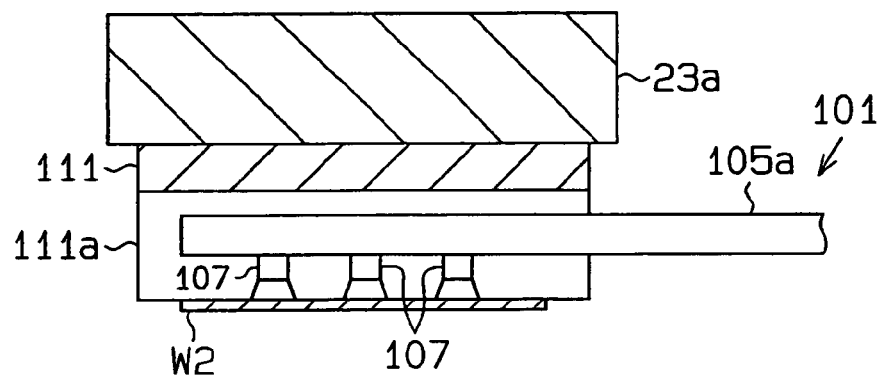
FIGS. 15A and 15B show a press plate according to the second embodiment.
Figure 15B:
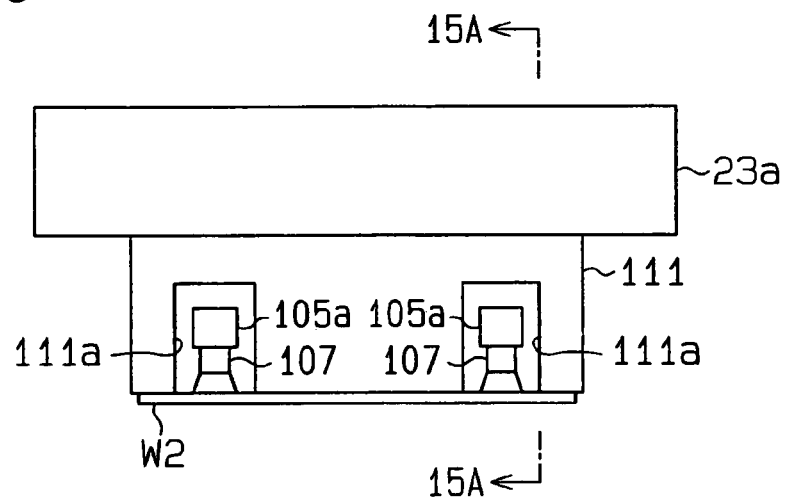

In a case where the second substrate W2 is carried into the press machine 15 by the first hand 105*a* (to be held on the press plate 24*a*), it is preferable to use a press plate 111 shown in FIGS. 15A and 15B. The press plate 111 has a channel 111*a* formed along the moving passage of the first hand 105*a*. The first hand 105*a* moves under the press plate 111 while holding the outer surface of the second substrate W2 and moves upward to a position where the second substrate W2 comes close to the chuck surface of the press plate 111 as shown in FIGS. 15A and 15B. As the first hand 105*a* is retained in the channel 111*a* at that time, it does not interfere with the press plate 111. In this state, the press plate 111 chucks and holds the second substrate W2 by at least one of suction and electrostatic force. After suction of the second substrate W2 is stopped, the first hand 105*a* moves upward to be away from the second substrate W2. Finally, the first transfer arm 105 is pulled back.

Because the first hand 105*a* sucks and holds the outer surface of the second substrate W2, weight-originated bending of the second substrate W2 is prevented even if the second substrate W2 is large and thin. The second substrate W2 is therefore chucked to the chuck surface of the press plate 111 in an approximately flat state.

At least one of the first and second transfer arms 105 and 106 of the transfer robot 101 is provided with two hands. Accordingly, the second transfer arm 106 may have two hands.

The first hand 105*a* may be replaced with the hand 31*a* in FIG. 2. In this case, for example, the hand 31*a* which transfers the second substrate W2 is provided at the first transfer arm 105 and the second hand 105*b* which transfers the substrate W1 and the third hand 106*a* which transfers the integrated substrate W1, W2 are provided at the second transfer arm 106.

The positioning device 102 will be discussed below.

In case of bonding the substrates W1 and W2, the substrates W1 and W2 should be aligned at a high precision (within an error of several micrometers). In this respect, alignment marks of a size of microns are formed on the substrates W1 and W2. Normally, a lens with a long focal distance is needed to simultaneously catch the alignment marks of the two apart substrates W1 and W2. Such a lens is however complex in structure and expensive. It is therefore preferable that the positioning device 102 should perform preliminary positioning of the substrates W1 and W2 before the press machine 15 would bond the substrates W1 and W2.

Figure 14A:
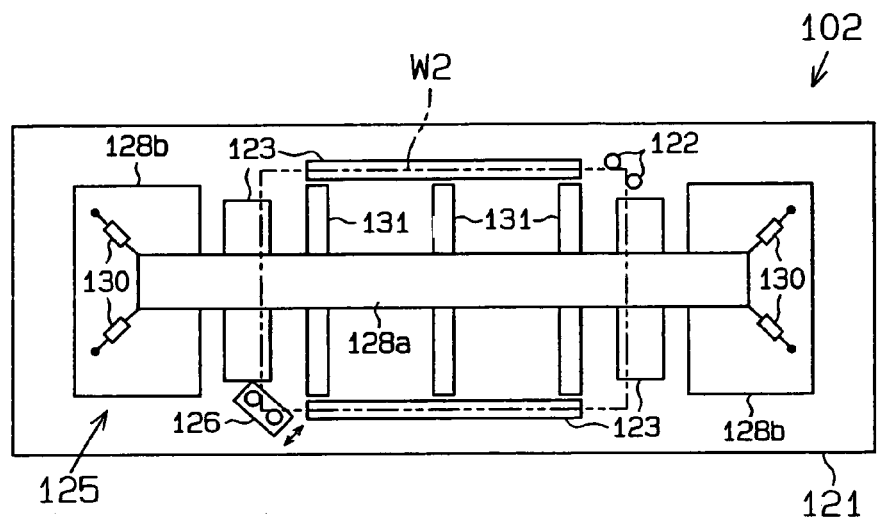
FIG. 14A is a plan view of a positioning device in FIG. 12.
Figure 14B:
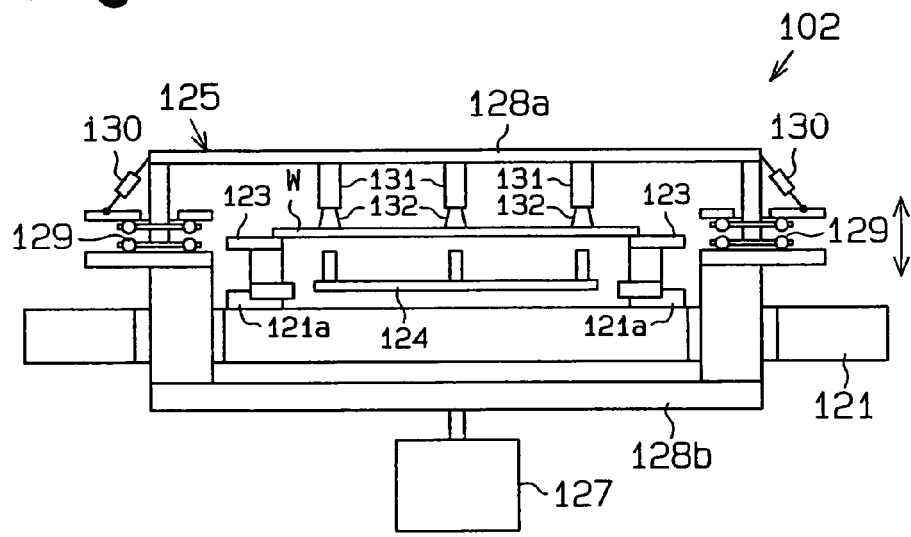
FIG. 14B is a side view of the positioning device in FIG. 14A.

As shown in FIG. 14, the positioning device 102 has a base plate 121, positioning pins 122 attached to the base plate 121, support plates 123 for supporting the second substrate W2, a support pin 124 which supports the substrate W1, a chuck mechanism 125, a positioning mechanism 126 and a linear actuator 127.

The support plates 123 are movable to a position for supporting the outer edge area of the inner surface of the second substrate W2 and a position apart from the second substrate W2 along linear guides 121*a* provided on the base plate 121. The support pin 124 is movable up and down. The positioning mechanism 126 is movable as indicated by arrows in FIG.

14A. The driving of the support plates 123, the support pin 124 and the positioning mechanism 126 is controlled by a drive source, such as unillustrated cylinders or the like.

The chuck mechanism 125 is supported by the linear actuator 127 in such a way as to be movable up and down with respect to the base plate 121. The chuck mechanism 125 has an upper plate 128a, a lower plate 128b, a bearing 129 which supports the upper plate 128a in such a way that the upper plate 128a is movable horizontally in the directions of the X axis and Y axis with respect to the lower plate 128b, and a spring 130 which urges the upper plate 128a to a reference position (the position shown in FIG. 14A) of the lower plate 128b. A plurality of chuck portions 131 are provided on the bottom surface of the upper plate 128a in parallel at predetermined pitches. Each chuck portion 131 has a chuck pad 132.

The positioning of the substrates W1 and W2 will be discussed below.

First, the second substrate W2 is positioned as follows. The chuck mechanism 125 is moved upward and the support pin 124 is moved downward. The third transfer equipment 17c (see FIG. 1) transfers the second substrate W2 to the positioning device 102 from the liquid crystal dropping device 13. As a result, the second substrate W2 is supported on the support plates 123 as indicated by a two-dot chain line in FIG. 14A.

As the second substrate W2 is placed on the support plates 123, the chuck mechanism 125 is moved downward and sucks and holds the top surface (outer surface) of the second substrate W2 by means of the chuck pads 132. The chuck mechanism 125 is moved upward together with the second substrate W2 and the support plates 123 are moved to positions where the support plates 123 do not interfere with the second substrate W2. The second substrate W2 is suspended from the chuck mechanism 125.

Next, the positioning mechanism 126 moves forward to move the second substrate W2 horizontally toward the positioning pins 122 provided diagonal to the positioning mechanism 126. The positioning mechanism 126 pushes the edge (the corner or the side near the corner) of the second substrate W2 until a predetermined position or until the corner of the second substrate W2 abuts on the positioning pins 122. At that time, the chuck mechanism 125 which is holding the second substrate W2 moves too. The movements of the chuck mechanism 125 and the second substrate W2 are carried out smoothly by the bearing 129.

The transfer robot 101 extends the first transfer arm 105. The first hand 105a sucks and holds the top surface of the second substrate W2 placed in a predetermined position. When the transfer robot 101 holds the second substrate W2, the chuck mechanism 125 stops sucking the second substrate W2. After chucking of the second substrate W2 is stopped, the chuck mechanism 125 is moved upward by the linear actuator 127 and is returned to the reference position by the urging force of the spring 130.

Next, the third transfer equipment 17c (see FIG. 1) transfers the substrate W1 to the positioning device 102 from the liquid crystal dropping device 13. Before the transfer, the chuck mechanism 125 should have been moved upward and the support plates 123 should have been moved to positions where the support plates 123 do not interfere with the substrate W1. The substrate W1 is supported by the lifted-up support pin 124. The positioning mechanism 126 pushes the edge of the substrate W1 to move the substrate W1 to a predetermined position. The transfer robot 101 extends the first transfer arm 105 and sucks and holds the bottom surface of the substrate W1 by means of the second hand 105b.

According to the positioning device 102, the second substrate W2 is chucked by the chuck mechanism 125 having the chuck pads 132, so that bending of the second substrate W2 due to its dead load is suppressed and the second substrate W2 is positioned in an approximately flat state by the positioning mechanism 126.

By way of contrast, the conventional positioning device does not have the chuck mechanism 125. In a case where the second substrate W2 is large or thin, therefore, the second substrate W2 bends. Thus, when the bent substrate is positioned, the bending of the second substrate W2 becomes greater, so that accurate positioning cannot be ensured, disadvantageously.

According to the second embodiment, the second substrate W2 is positioned in an approximately flat state, thus improving the precision of positioning the second substrate W2. This results in an improvement on the alignment precision in the press machine 15.

The second embodiment has the following advantages in addition to the advantages (1) to (6).

(7) The transfer robot 101 includes the first transfer arm 105 having the first and second hands 105a and 105b and the second transfer arm 106 having the third hand 106a. As the transfer robot 101 can carry two substrates W1 and W2 into the press machine 15 at a time, the number of the swing operations and extensible and contractible operations of the transfer robot 101 is reduced and the transfer time is shortened. This makes it possible to shorten the transfer-oriented idling time of the press machine 15, thus improving the productivity of the bonded substrate.

(8) The first and second hands 105a and 105b suck and hold the outer surfaces of the substrates W2 and W1. This allows even large and thin substrates W2 and W1 to be stably held in an approximately flat state without being bent. Because the first and second hands 105a and 105b can be attached to the first transfer arm 105 at relatively narrow pitches, enlargement of the press machine 15 can be avoided.

(9) Because the positioning device 102 positions the second substrate W2 held on the chuck mechanism 125 in an approximately flat state, the positioning precision is improved. This results in an improved positioning precision in the press machine 15. As the positioning device 102 can position the second substrate W2 quickly, the alignment time in the press machine 15 is shortened, thus shortening the fabrication time for bonded substrates.

(10) As the first and second hands 105a and 105b do not contact the inner surfaces of the substrates W2 and W1, changes in the properties of the inner surfaces of the substrates W2 and W1 are prevented.

A description will now be given of a press machine 141 and a bonding method according to the third embodiment of the invention. As like or same reference numerals are given to those components which are the same as the corresponding components of the first embodiment that has been described earlier with reference to FIG. 2, some of their detailed descriptions will not be repeated.

Figure 16:
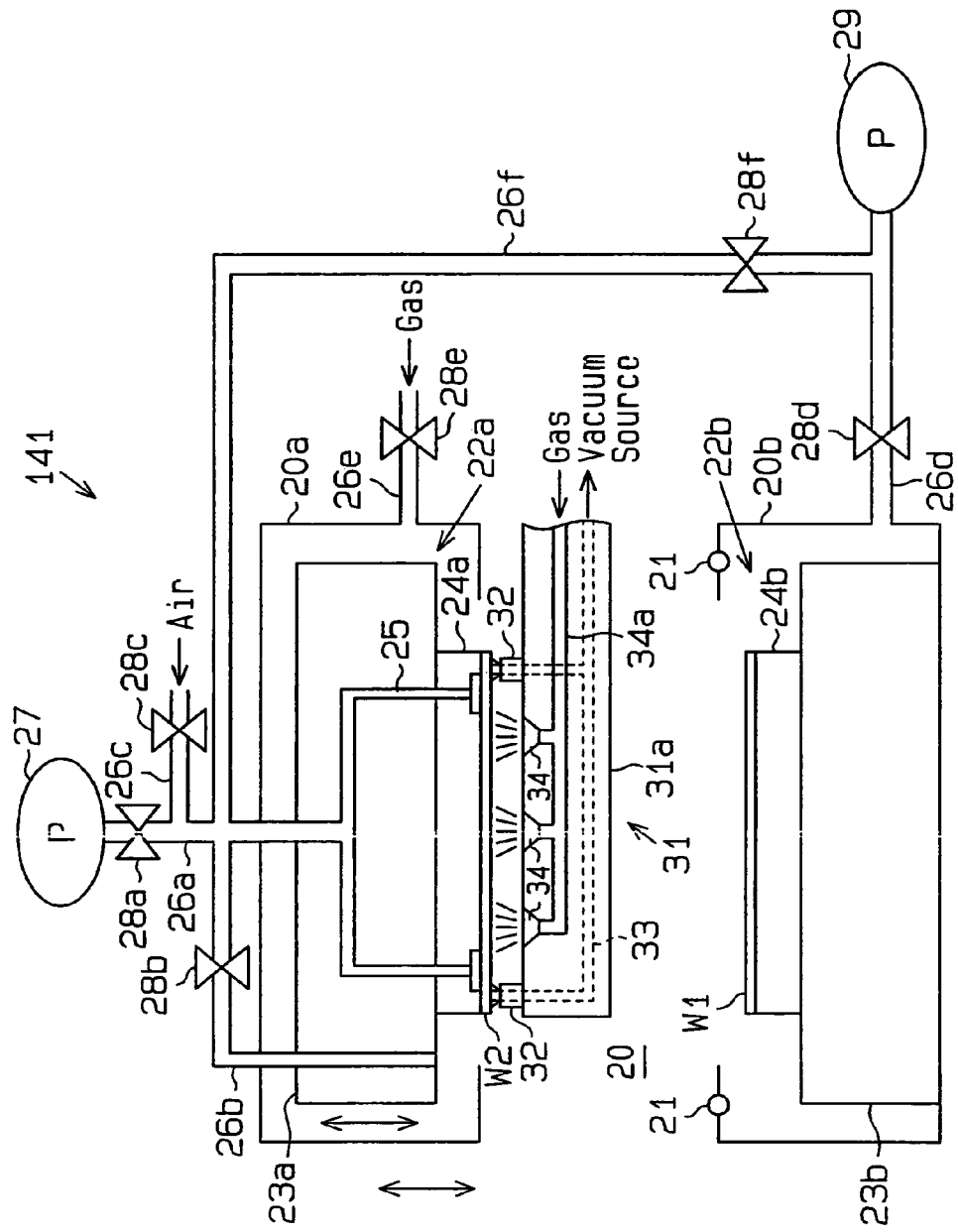
FIG. 16 is a schematic diagram of the chuck mechanism of a press machine according to a third embodiment of the present invention.

As shown in FIG. 16, the press machine 141 has a first exhaust valve 28d for evacuating the vacuum process chamber 20, a bypass pipe 26f which connects the main pipe 26a to the depressurizing pipe 26d, and a second exhaust valve 28f which is provided in the bypass pipe 26f and evacuates the main pipe 26a and vacuum line 25. The opening/closing action of the second exhaust valve 28f is controlled by the unillustrated control unit.

In a case where the press machine 141 is used, steps S151 to S153 in FIG. 17 are executed in place of step S48 in FIG. 5 and step S70 in FIG. 6. That is, in step S151, the press machine 141 opens the first and second exhaust valves 28*d* and 28*f* and opens the gas inlet valve 28*e* and starts gas substitution in the vacuum process chamber 20.

At the beginning of the depressurization of the vacuum process chamber 20, the exhaust valves 28*d* and 28*f* are opened relatively narrowly so that a variation in pressure does not become too large. A variation in pressure may be adjusted by increasing the rotational speed of the vacuum pump 29 gradually.

In step S152, the press machine 141 gradually increases the degrees of opening of the first and second exhaust valves 28*d* and 28*f* in such a way that the back pressure of the second substrate W2 becomes approximately equal to or lower than the chamber pressure. When the chamber pressure and the back pressure of the second substrate W2 reach predetermined values, the press machine 141 fully opens both exhaust valves 28*d* and 28*f* (step S153).

The subsequent steps are the same as those of the first embodiment. That is, after the gas substitution in the vacuum process chamber 20 is completed, the gas inlet valve 28*e* is closed and the substrates W1 and W2 are aligned and pressed.

According to the third embodiment, the degrees of opening of the exhaust valves 28*d* and 28*f* (the exhaust speed and depressurizing speed) are adjusted, so that even when the conductance from the chuck surface of the press plate 24*a* to the vacuum process chamber 20 (the degrees of vacuum in the vacuum line 25 and the pipes 26*a* and 26*b*) is relatively small, it is possible to adjust the back pressure of the second substrate W2 to be approximately equal to or lower than the chamber pressure. In other words, even when the passage from the chuck surface of the press plate 24*a* to the vacuum process chamber 20 is narrow and depressurization is difficult, advantages similar to those of the first embodiment can be acquired. Note that the third embodiment brings about similar advantages even without the pipe 26*b* and the back pressure release valve 28*b*.

A fabrication apparatus and method for bonded substrates according to the fourth embodiment of the invention will be discussed below.

Figure 18A:
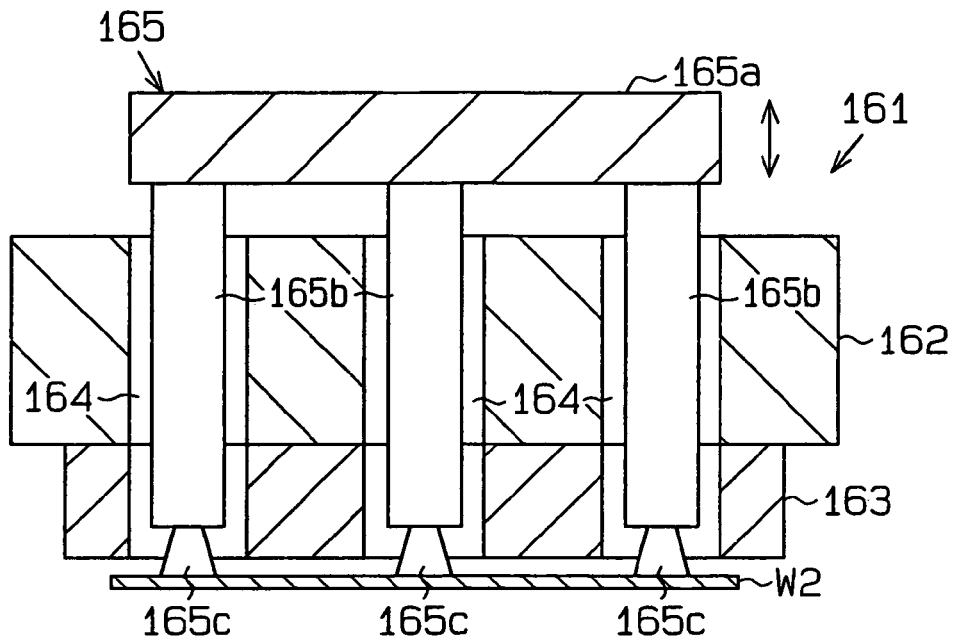
FIGS. 18A and 18B show the chuck mechanism of a press plate according to a fourth embodiment of the present invention.

FIG. 18A shows an upper holding plate 161 according to the fourth embodiment. The upper holding plate 161 includes an upper surface plate 162 and a press plate 163. Through passages 164 are formed in such a way as to extend from the chuck surface of the press plate 163 to the top surface of the upper surface plate 162.

The upper holding plate 161 includes a chuck mechanism 165 which is supported by an unillustrated drive mechanism in such a way as to be movable up and down. The chuck mechanism 165 comprises a top plate 165*a*, chuck portions 165*b* supported on the top plate 165*a* and chuck pads 165*c* provided at the distal ends (lower ends) of the individual chuck portions 165*b*. The chuck portions 165*b* are respectively inserted into the through passages 164. The chuck pads 165*c* are connected to a vacuum source via an unillustrated passage. The suction force from the vacuum source allows the outer surface of the second substrate W2 to be sucked to the chuck portions 165*b*.

As shown in FIG. 18A, the chuck mechanism 165 is lifted downward in such a way that the chuck pads 165*c* are placed below the chuck surface of the press plate 163. The second substrate W2 held by the transfer robot 31 (FIG. 2) is chucked to the chuck pads 165*c*.

The chuck mechanism 165 is lifted upward to a position where the second substrate W2 comes close to the chuck surface of the press plate 163. As the suction force or electrostatic force is allowed to act on the second substrate W2 in that state, the second substrate W2 is sucked to the press plate 163 and the chucking work of the chuck mechanism 165 is stopped. As a result, the second substrate W2 is held on the press plate 163 (FIG. 18B).

According to the fourth embodiment, the second substrate W2 is held on the press plate 163 while being sucked by the chuck portions 165*b*. Therefore, the second substrate W2 even bent greatly is held on the press plate 163 in an approximately flat state, thus preventing positional deviation and separation of the second substrate W2.

Figure 18B:
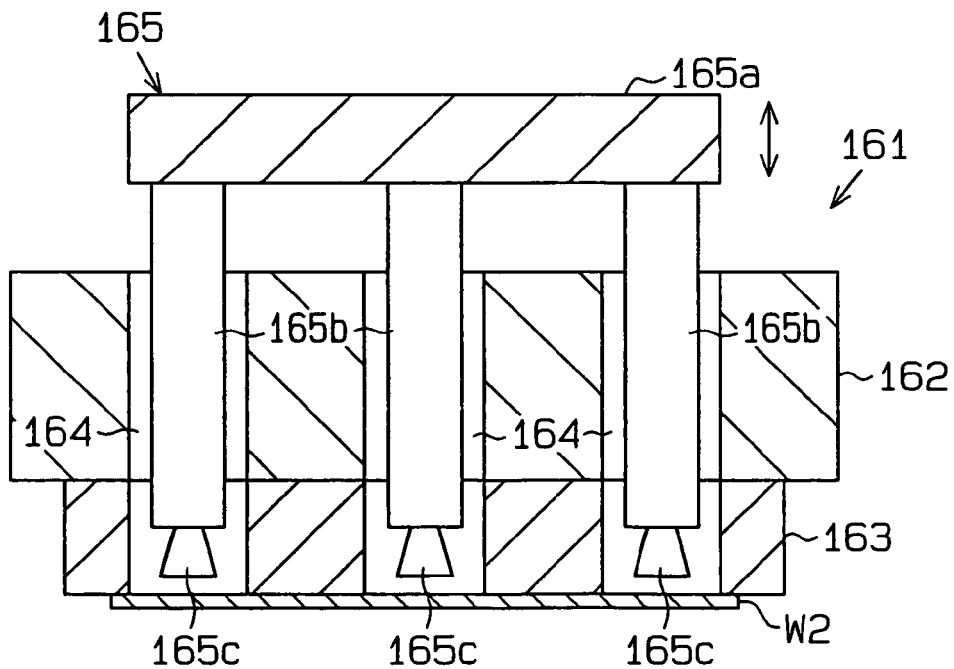

As shown in FIG. 18B, the pressure in the vacuum process chamber 20 acts on the top surface of the second substrate W2 via the through passages 164. During depressurization of the vacuum process chamber 20, therefore, the back pressure of the second substrate W2 does not become higher than the chamber pressure, thus preventing separation of the second substrate W2.

The chuck portions 165*b* may be moved up and down individually and independently. In this case, a substrate which is bent greatly is chucked smoothly.

It should be apparent to those skilled in the art that the present invention may be embodied in many other specific forms without departing from the spirit or scope of the invention.

Although the transfer of the substrate W2 has been described in the description of the first embodiment, the lower substrate W1 may likewise be transferred while a gas is injected toward the bottom surface of the lower substrate W1.

In the bonding method in FIG. 5, step S44 (tight closing of the vacuum process chamber 20) may be executed after step S47.

The transfer robot 31 may spout a gas other than an inactive gas toward the bottom surface of the second substrate W2.

A filter may be provided upstream of the gas injection nozzle 34 so that dust does not stick to the second substrate W2.

The transfer robot 31 may be modified in such a way as to have a mechanism which chucks the top surface of the second substrate W2 while spouting a gas to the bottom surface of the second substrate W2 in a case where the second substrate W2 is large.

The first memory device 87*a* and the second memory device 87*b* which store the substrate ID and pole height information may be provided in a server connected to the bonded-substrate fabricating apparatus 10 via a network.

The parts that are respectively held by the first to third hands 105*a*, 105*b* and 106*a* are not limited to those types which have been discussed in the foregoing descriptions of the embodiments. To describe in detail, the substrate W1 may be held and transferred by the third hand 106*a*, and the integrated substrate W1, W2 may be held and carried out of the press machine 15 by the second hand 105*b*. In case where the substrates W2 and W1 are respectively held by the first and second hands 105*a* and 105*b* of the first transfer arm 105 as described in the descriptions of the embodiments, dust is prevented from falling on the surface of the substrate W1.

Therefore, the present examples and embodiments are to be considered as illustrative and not restrictive and the invention is not to be limited to the details given herein, but may be modified within the scope and equivalence of the appended claims.

What is claimed is:

1. A method of bonding two substrates held by first and second holding plates arranged to face each other in a process chamber, the method comprising:

vacuum holding at least one of the two substrates by at least one of the first or second holding plates in the process chamber;

feeding a gas in the process chamber to elevate pressure in the process chamber to a predetermined elevated pressure higher than the atmospheric pressure;

electrostatically holding said at least one of the two substrates by said at least one of the first or second holding plates after the pressure in the process chamber is elevated to the predetermined elevated pressure, pressing the two substrates to bond to each other after said electrostatically holding said at least one of the two substrates; and stopping the vacuum holding before pressing the two substrates.

2. The method of bonding two substrates according to claim 1, wherein said stopping is performed when the pressure in the process chamber is higher than the atmospheric pressure.

3. The method of bonding two substrates according to claim 1, further comprising evacuating the process chamber before pressing the two substrates and after electrostatically holding said at least one of the two substrates.

4. The method of bonding two substrates according to claim 1, further comprising:

evacuating the process chamber before said pressing the two substrates and after both of said electrostatically holding said at least one of the two substrates and said stopping the vacuum holding.

* * * * *

UNITED STATES PATENT AND TRADEMARK OFFICE
CERTIFICATE OF CORRECTION

| | |
|---|---|
| PATENT NO. | : 7,597,774 B2 |
| APPLICATION NO. | : 11/254744 |
| DATED | : October 6, 2009 |
| INVENTOR(S) | : Takanori Muramoto et al. |

Page 1 of 1

It is certified that error appears in the above-identified patent and that said Letters Patent is hereby corrected as shown below:

Title Page, Item (56) Column 2 (Other Publications), Line 1, change "Sep. 22, 2003," to --Jan. 22, 2003,--.

Signed and Sealed this

Nineteenth Day of January, 2010

David J. Kappos
*Director of the United States Patent and Trademark Office*